US007816064B2

(12) United States Patent
Oguma et al.

(10) Patent No.: US 7,816,064 B2
(45) Date of Patent: Oct. 19, 2010

(54) IMAGE-FORMING METHOD USING HEAT-SENSITIVE TRANSFER SYSTEM

(75) Inventors: Kazuaki Oguma, Minami-ashigara (JP); Yoshio Ishii, Minami-ashigara (JP); Hisashi Mikoshiba, Minami-ashigara (JP); Hiroshi Takehara, Minami-ashigara (JP); Yoshihisa Tsukada, Minami-ashigara (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/711,696

(22) Filed: Feb. 28, 2007

(65) Prior Publication Data

US 2007/0212634 A1 Sep. 13, 2007

(30) Foreign Application Priority Data

Feb. 28, 2006 (JP) ............................. 2006-051861

(51) Int. Cl.

| | |
|---|---|
| ***G03C 8/00*** | (2006.01) |
| ***G03F 7/00*** | (2006.01) |
| ***B41M 5/20*** | (2006.01) |
| ***B41M 5/24*** | (2006.01) |

(52) U.S. Cl. .................. 430/201; 430/270.1; 428/32.5; 503/227

(58) Field of Classification Search ................. 430/201; 428/32.5; 503/227

See application file for complete search history.

(56) References Cited

U.S. PATENT DOCUMENTS

| | | | | |
|---|---|---|---|---|
| 4,429,076 | A * | 1/1984 | Saito et al. | 525/57 |
| 4,506,278 | A * | 3/1985 | Sakamoto et al. | 503/217 |
| 4,508,778 | A * | 4/1985 | Achard | 428/364 |
| 4,529,768 | A * | 7/1985 | Achard et al. | 524/365 |
| 4,868,247 | A * | 9/1989 | Lehr et al. | 525/239 |
| 5,059,580 | A * | 10/1991 | Shibata et al. | 503/227 |
| 5,071,823 | A * | 12/1991 | Matsushita et al. | 503/227 |
| 5,116,804 | A * | 5/1992 | Kakuda et al. | 503/209 |
| 5,260,257 | A * | 11/1993 | Eguchi et al. | 503/227 |
| 5,384,303 | A * | 1/1995 | Nishimura et al. | 503/209 |
| 5,393,726 | A * | 2/1995 | Graumann | 503/227 |
| 5,532,202 | A * | 7/1996 | Yoshida | 503/227 |
| 6,238,784 | B1 * | 5/2001 | Mochizuki et al. | 428/32.28 |
| 6,306,961 | B1 * | 10/2001 | Tone et al. | 525/63 |
| 6,329,127 | B1 * | 12/2001 | Ito et al. | 430/350 |
| 6,372,689 | B1 * | 4/2002 | Kuga et al. | 503/227 |
| 6,670,000 | B1 * | 12/2003 | Misuda et al. | 428/32.1 |
| 7,223,513 | B2 * | 5/2007 | Nakane et al. | 430/200 |
| 7,332,109 | B2 * | 2/2008 | Senga et al. | 252/586 |
| 2005/0266185 | A1 * | 12/2005 | Sekiya et al. | 428/32.39 |

FOREIGN PATENT DOCUMENTS

| | | |
|---|---|---|
| JP | 04-085079 A | 3/1992 |
| JP | 04-107186 A | 4/1992 |
| JP | 04-107547 A | 4/1992 |
| JP | 5-221161 | 8/1993 |
| JP | 7-232482 | 9/1995 |

OTHER PUBLICATIONS

Office Action for Japanese Patent Application No. 2006-051861 dated Nov. 24, 2009.

* cited by examiner

*Primary Examiner*—Amanda C. Walke
(74) *Attorney, Agent, or Firm*—Sughrue Mion, PLLC

(57) ABSTRACT

An image-forming method, containing the steps of: superposing a heat-sensitive transfer sheet on a heat-sensitive transfer image-receiving sheet so that the following receptor layer can be contacted with the following thermal transfer layer; and providing thermal energy in accordance with image signals, thereby to form a thermal transfer image;
in which the heat-sensitive transfer image-receiving sheet comprises, on a support, a receptor layer containing a polymer latex, and a heat insulation layer containing hollow polymer particles, and the heat-sensitive transfer sheet comprises, on a support, a thermal transfer layer containing any one of compounds represented by formulas (1) to (7):

Formula (1)

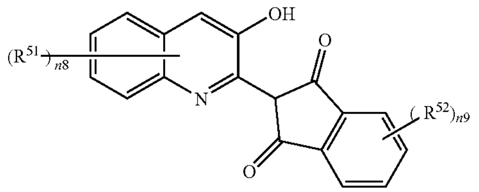

Formula (2)

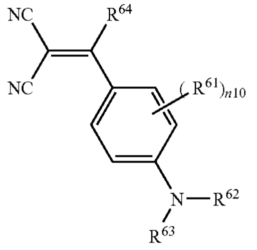

Formula (3)

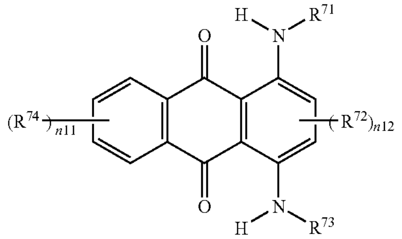

Formula (4)

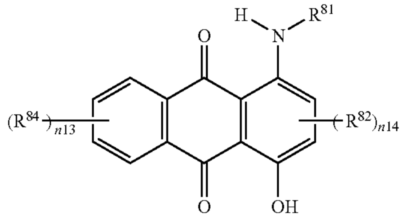

-continued
Formula (5)
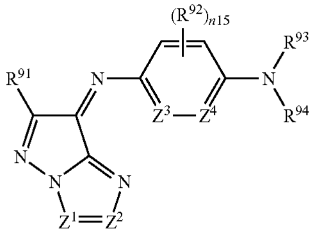
Formula (6)
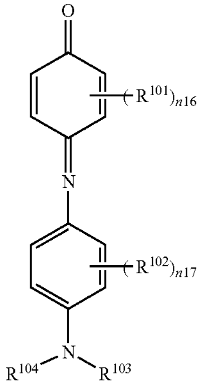
-continued
Formula (7)
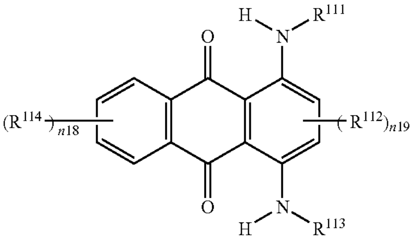
in which, one of $Z^1$ and $Z^2$ represents ═N— and the other represents ═C($R^{95}$)—; $Z^3$ and $Z^4$ each independently represents ═N— or ═C($R^{96}$)—; $R^{51}$ to $R^{114}$ each independently represent a substituent, or a hydrogen atom or a substituent; n8 to n18 each independently represent an integer of 0 to 5, 0 to 4 or 0 to 2.
32 Claims, No Drawings

IMAGE-FORMING METHOD USING HEAT-SENSITIVE TRANSFER SYSTEM

FIELD OF THE INVENTION

The present invention relates to an image-forming method using a thermal transfer system (heat-sensitive transfer system), which provides an image having a high density, a high image quality and an excellent fastness for the image.

BACKGROUND OF THE INVENTION

Various heat transfer recording methods have been known so far. Among these methods, dye diffusion transfer recording systems attract attention as a process that can produce a color hard copy having an image quality closest to that of silver salt photography (see, for example, "Joho Kiroku (Hard Copy) to Sono Zairyo no Shintenkai (Information Recording (Hard Copy) and New Development of Recording Materials)" published by Toray Research Center Inc., 1993, pp. 241-285; and "Printer Zairyo no Kaihatsu (Development of Printer Materials)" published by CMC Publishing Co., Ltd., 1995, p. 180). Moreover, this system has advantages over silver salt photography: it is a dry system, it enables direct visualization from digital data, it makes reproduction simple, and the like.

In this dye diffusion transfer recording system, a heat-sensitive transfer sheet (hereinafter also referred to as an ink sheet) containing dyes is superposed on a heat-sensitive transfer image-receiving sheet (hereinafter also referred to as an image-receiving sheet), and then the ink sheet is heated by a thermal head whose exothermic action is controlled by electric signals, in order to transfer the dyes contained in the ink sheet to the image-receiving sheet, thereby recording an image information. Three colors: cyan, magenta, and yellow, are used for recording a color image by overlapping one color to other, thereby enabling transferring and recording a color image having continuous gradation for color densities.

Various dyes are proposed to use in this system (see, for example, JP-A-7-232482 ("JP-A" means unexamined published Japanese patent application) and JP-A-5-221161). However, an image fastness achieved by these dyes is not always satisfactory, and further improvement in the image quality has been desired.

SUMMARY OF THE INVENTION

The present invention resides in an image-forming method, comprising the steps of:

superposing a heat-sensitive transfer sheet on a heat-sensitive transfer image-receiving sheet so that the following at least one receptor layer of the heat-sensitive transfer image-receiving sheet can be contacted with the following thermal transfer layer of the heat-sensitive transfer sheet; and providing thermal energy in accordance with image signals, thereby to form a thermal transfer image;

wherein the heat-sensitive transfer image-receiving sheet comprises, on a support, at least one receptor layer containing a polymer latex and at least one heat insulation layer containing hollow polymer particles, and wherein the heat-sensitive transfer sheet comprises, on a support, a thermal transfer layer containing at least any one of compounds represented by formulas (1) to (7):

Formula (1)

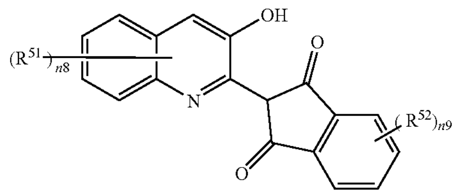

wherein, in formula (1), $R^{51}$ and $R^{52}$ each independently represents a substituent; n8 represents an integer of 0 to 5; n9 represents an integer of 0 to 4; when n8 represents an integer of 2 to 5, $R^{51}$s may be the same or different from each other; and when n9 represents an integer of 2 to 4, $R^{52}$s may be the same or different from each other;

Formula (2)

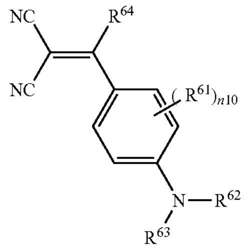

wherein, in formula (2), $R^{61}$ represents a substituent; $R^{62}$, $R^{63}$ and $R^{64}$ each independently represents a hydrogen atom or a substituent; n10 represents an integer of 0 to 4; and when n10 represents an integer of 2 to 4, $R^{61}$s may be the same or different from each other;

Formula (3)

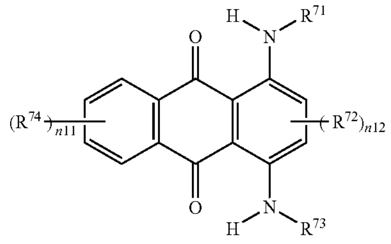

wherein, in formula (3), $R^{71}$ and $R^{73}$ each independently represents a hydrogen atom or a substituent; $R^{72}$ and $R^{74}$ each independently represents a substituent; n11 represents an integer of 0 to 4; n12 represents an integer of 0 to 2; when n11 represents an integer of 2 to 4, $R^{74}$s may be the same or different from each other; and when n12 represents 2, $R^{72}$s may be the same or different from each other;

Formula (4)

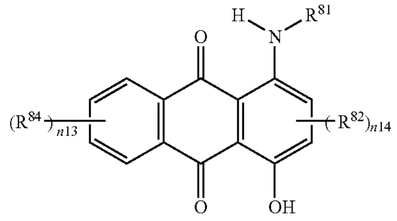

wherein, in formula (4), $R^{81}$ represents a hydrogen atom, or a substituent; $R^{82}$ and $R^{84}$ each independently represents a substituent; n13 represents an integer of 0 to 4; n14 represents an integer of 0 to 2; when n13 represents an integer of 2 to 4, $R^{84}$s may be the same or different from each other; and when n14 represents 2, $R^{82}$s may be the same or different from each other;

Formula (5)

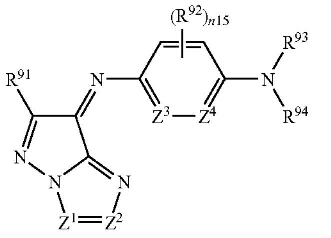

wherein, in formula (5), $R^{91}$ represents a hydrogen atom or a substituent; $R^{92}$ represents a substituent; $R^{93}$ and $R^{94}$ each independently represents a hydrogen atom or a substituent; n15 represents an integer of 0 to 2; when n15 represents 2, $R^{92}$s may be the same or different from each other; one of $Z^1$ and $Z^2$ represents $=N-$ and the other represents $=C(R^{95})-$; $Z^3$ and $Z^4$ each independently represents $=N-$ or $=C(R^{96})-$; and $R^{95}$ and $R^{96}$ each independently represents a hydrogen atom or a substituent;

Formula (6)

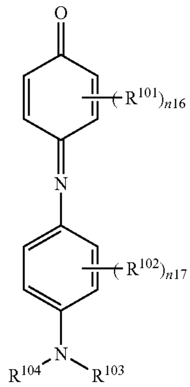

wherein, in formula (6), $R^{101}$ and $R^{102}$ each independently represents a substituent; $R^{103}$ and $R^{104}$ each independently represents a hydrogen atom or a substituent; n16 and n17 each independently represents an integer of 0 to 4; when n16 represents an integer of 2 to 4, $R^{101}$s may be the same or different from each other; and when n17 represents an integer of 2 to 4, $R^{102}$s may be the same or different from each other; and Formula (7)

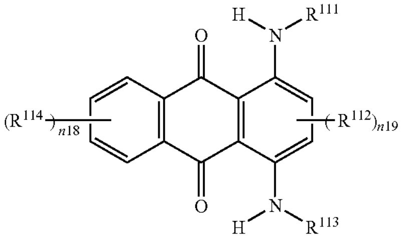

wherein, in formula (7), $R^{111}$ and $R^{113}$ each independently represents a hydrogen atom or a substituent; $R^{112}$ and $R^{114}$ each independently represents a substituent; n18 represents an integer of 0 to 4; n19 represents an integer of 0 to 2; when n18 represents an integer of 2 to 4, $R^{114}$s may be the same or different from each other; and when n19 represents 2, $R^{112}$s may be the same or different from each other.

Other and further features and advantages of the invention will appear more fully from the following description.

DETAILED DESCRIPTION OF THE INVENTION

According to the present invention, there is provided the following means:

(1) An image-forming method, comprising the steps of:

superposing a heat-sensitive transfer sheet on a heat-sensitive transfer image-receiving sheet so that the following at least one receptor layer of the heat-sensitive transfer image-receiving sheet can be contacted with the following thermal transfer layer of the heat-sensitive transfer sheet; and providing thermal energy in accordance with image signals, thereby to form a thermal transfer image;

wherein the heat-sensitive transfer image-receiving sheet comprises, on a support, at least one receptor layer containing a polymer latex and at least one heat insulation layer containing hollow polymer particles, and wherein the heat-sensitive transfer sheet comprises, on a support, a thermal transfer layer containing at least any one of compounds represented by formulas (1) to (7):

Formula (1)

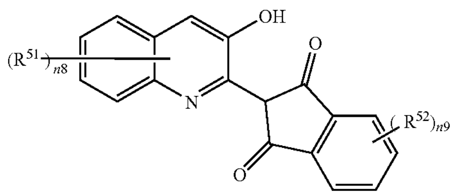

wherein, in formula (1), $R^{51}$ and $R^{52}$ each independently represents a substituent; n8 represents an integer of 0 to 5; n9 represents an integer of 0 to 4; when n8 represents an integer of 2 to 5, $R^{51}$s may be the same or different from each other; and when n9 represents an integer of 2 to 4, $R^{52}$s may be the same or different from each other;

Formula (2)

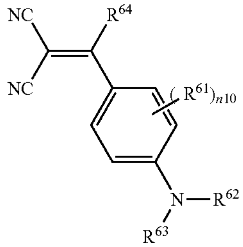

wherein, in formula (2), $R^{61}$ represents a substituent; $R^{62}$, $R^{63}$ and $R^{64}$ each independently represents a hydrogen atom or a substituent; n10 represents an integer of 0 to 4; and when n10 represents an integer of 2 to 4, $R^{61}$s may be the same or different from each other;

Formula (3)

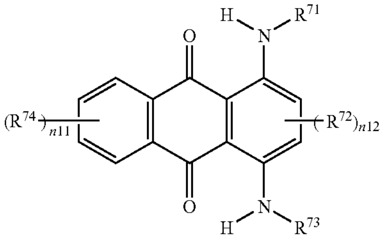

wherein, in formula (3), $R^{71}$ and $R^{73}$ each independently represents a hydrogen atom or a substituent; $R^{72}$ and $R^{74}$ each independently represents a substituent; n11 represents an integer of 0 to 4; n12 represents an integer of 0 to 2; when n11 represents an integer of 2 to 4, $R^{74}$s may be the same or different from each other; and when n12 represents 2, $R^{72}$s may be the same or different from each other;

Formula (4)

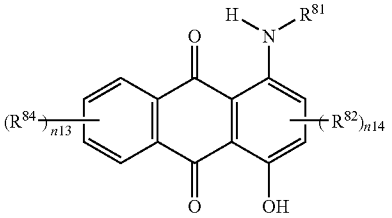

wherein, in formula (4), $R^{81}$ represents a hydrogen atom, or a substituent; $R^{82}$ and $R^{84}$ each independently represents a substituent; n13 represents an integer of 0 to 4; n14 represents an integer of 0 to 2; when n13 represents an integer of 2 to 4, $R^{84}$s may be the same or different from each other; and when n14 represents 2, $R^{82}$s may be the same or different from each other;

Formula (5)

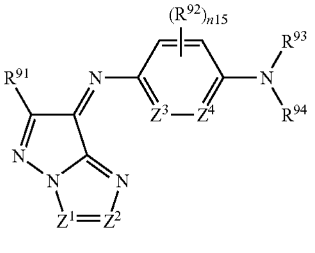

wherein, in formula (5), $R^{91}$ represents a hydrogen atom or a substituent; $R^{92}$ represents a substituent; $R^{93}$ and $R^{94}$ each independently represents a hydrogen atom or a substituent; n15 represents an integer of 0 to 2; when n15 represents 2, $R^{92}$s may be the same or different from each other; one of $Z^1$ and $Z^2$ represents =N— and the other represents =C($R^{95}$)—; $Z^3$ and $Z^4$ each independently represents =N— or =C($R^{96}$)—; and $R^{95}$ and $R^{96}$ each independently represents a hydrogen atom or a substituent;

Formula (6)

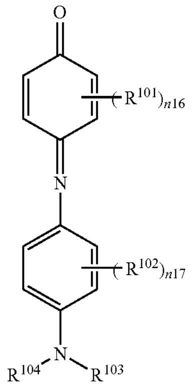

wherein, in formula (6), $R^{101}$ and $R^{102}$ each independently represents a substituent; $R^{103}$ and $R^{104}$ each independently represents a hydrogen atom or a substituent; n16 and n17 each independently represents an integer of 0 to 4; when n16 represents an integer of 2 to 4, $R^{101}$ may be the same or different from each other; and when n17 represents an integer of 2 to 4, $R^{102}$s may be the same or different from each other; and Formula (7)

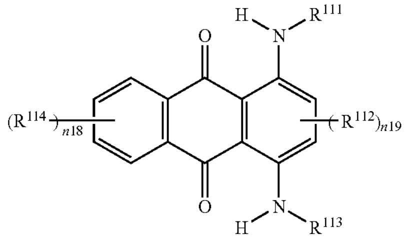

wherein, in formula (7), $R^{111}$ and $R^{113}$ each independently represents a hydrogen atom or a substituent; $R^{112}$ and $R^{114}$ each independently represents a substituent; n18 represents an integer of 0 to 4; n19 represents an integer of 0 to 2; when n18 represents an integer of 2 to 4, $R^{114}$s may be the same or different from each other; and when n19 represents 2, $R^{112}$s may be the same or different from each other;

(2) The image-forming method as described in the above item (1), wherein a yellow component of the image formed in the image-receiving sheet according to the image-forming method is a dye originated from the compound represented by formula (1) or (2), a magenta component of the image formed in the image-receiving sheet according to the image-forming method is a dye originated from the compound represented by formula (3), (4) or (5), and a cyan component of the image formed in the image-receiving sheet according to the image-forming method is a dye originated from the compound represented by formula (6) or (7);

(3) The image-forming method as described in the above item (1) or (2), wherein at least one of layers of the heat-sensitive transfer image-receiving sheet contains a water-soluble polymer;

(4) The image-forming method as described in any one of the above items (1) to (3), wherein at least one of the receptor layer and the heat insulation layer of the heat-sensitive transfer image-receiving sheet contains a compound that enables to crosslink a water-soluble polymer;

(5) The image-forming method as described in any of the above items (1) to (4), wherein the receptor layer of the heat-sensitive transfer image-receiving sheet contains an emulsion;

(6) The image-forming method as described in any one of the above items (1) to (5), wherein the thermal energy is given by a thermal head; and (7) An image-forming system, comprising the steps of:

superposing a heat-sensitive transfer sheet on a heat-sensitive transfer image-receiving sheet so that the following at least one receptor layer of the heat-sensitive transfer image-receiving sheet can be contacted with the following thermal transfer layer of the heat-sensitive transfer sheet; and giving thermal energy in accordance with image signals, thereby to form a thermal transfer image;

wherein the heat-sensitive transfer image-receiving sheet comprises, on a support, at least one receptor layer containing a polymer latex and at least one heat insulation layer containing hollow polymer particles, and wherein the heat-sensitive transfer sheet comprises, on a support, a thermal transfer layer containing at least one of the compounds represented by formulas (1) to (7) described above.

The present invention is explained in detail below.

1) Heat-Sensitive Transfer Image-Receiving Sheet

First, the heat-sensitive transfer image-receiving sheet (image-receiving sheet) is explained.

The heat-sensitive (thermal) transfer image-receiving sheet used in the present invention is provided with at least one dye-receiving layer (receptor layer) on a support, and a heat insulation layer (porous layer) between the support and the receptor layer. Moreover, an undercoat layer such as a white-background-control layer, a charge-control layer (an electrification-control layer), an adhesive layer, and a primer layer, may be provided between the receptor layer and the heat insulation layer.

The receptor layer and the heat insulation layer are preferably formed by a simultaneous double-layer coating. When the undercoat layer is provided, the receptor layer, the undercoat layer and the heat insulation layer may be formed by the simultaneous double-layer coating.

It is preferable that a curling control layer, a writing layer, and a charge-control layer be formed on the backside of the support. Each layer on the backside of the support is applied using a usual method such as roll coating, bar coating, gravure coating, and gravure reverse coating.

(Receptor Layer)

The receptor layer performs functions of receiving dyes transferred from an ink sheet and retaining images formed. In the image-receiving sheet for use in the present invention, the receptor layer contains a polymer latex. The receptor layer may be a single layer or multi layers. The receptor layer preferably contains a water-soluble polymer as described later.

<Polymer Latex>

The polymer latex used in the present invention is explained.

In the heat-sensitive transfer image-receiving sheet used in the present invention, the polymer latex used in the receptor layer is a dispersion in which hydrophobic polymers comprising a monomer unit of water-insoluble vinyl chloride are dispersed as fine particles in a water-soluble dispersion medium. The dispersed state may be one in which polymer is emulsified in a dispersion medium, one in which polymer underwent emulsion polymerization, one in which polymer underwent micelle dispersion, one in which polymer molecules partially have a hydrophilic structure and thus the molecular chains themselves are dispersed in a molecular state, or the like. Latex polymers are described in "Gosei Jushi Emulsion (Synthetic Resin Emulsion)", compiled by Taira Okuda and Hiroshi Inagaki, issued by Kobunshi Kanko Kai (1978); "Gosei Latex no Oyo (Application of Synthetic Latex)", compiled by Takaaki Sugimura, Yasuo Kataoka, Souichi Suzuki, and Keishi Kasahara, issued by Kobunshi Kanko Kai (1993); Soichi Muroi, "Gosei Latex no Kagaku (Chemistry of Synthetic Latex)", issued by Kobunshi Kanko Kai (1970); Yoshiaki Miyosawa (supervisor) "Suisei Coating-Zairyo no Kaihatsu to Oyo (Development and Application of Aqueous Coating Material)", issued by CMC Publishing Co., Ltd. (2004) and JP-A-64-538, and so forth. The dispersed particles preferably have a mean particle size (diameter) of about 1 to 50,000 nm, more preferably about 5 to 1,000 nm.

The particle size distribution of the dispersed particles is not particularly limited, and the particles may have either wide particle-size distribution or monodispersed particle-size distribution.

The latex polymer for use in the present invention may be latex of the so-called core/shell type, other than ordinary latex polymer of a uniform structure. When using a core/shell type latex polymer, it is preferred in some cases that the core and the shell have different glass transition temperatures. The glass transition temperature (Tg) of the latex polymer for use in the present invention is preferably −30° C. to 100° C., more preferably 0° C. to 80° C., further more preferably 10° C. to 70° C., and especially preferably 15° C. to 60° C.

In the present invention, as a preferable embodiment of the polymer latex used in the receptor layer, there can be preferably used polyvinyl chlorides, a copolymer comprising a monomer unit of vinyl chloride such as a vinyl chloride-vinyl acetate copolymer, and a vinyl chloride acrylate copolymer. In case of the copolymer, the vinyl chloride monomer ratio is preferably in the range of from 50% to 95%. These polymers may be straight-chain, branched, or cross-linked polymers, the so-called homopolymers obtained by polymerizing single type of monomers, or copolymers obtained by polymerizing two or more types of monomers. In the case of the copolymers, these copolymers may be either random copolymers or block copolymers. The molecular weight of each of these polymers is preferably 5,000 to 1,000,000, and further preferably 10,000 to 500,000 in terms of number average molecular weight. Polymers having excessively small molecular weight impart insufficient dynamic strength to the layer containing the latex, and polymers having excessively large molecular weight bring about poor filming ability, and therefore both cases are undesirable. Crosslinkable latex polymers are also preferably used.

Among the above examples, the polymer latex for use in the present invention is preferably polyvinyl chlorides, more preferably a copolymer of vinyl chloride and an acrylic ester, further preferably one having a glass transition temperature (Tg) of 30 to 80° C.

The polymer latex that can be used in the present invention is commercially available, and polymers described below may be utilized. Examples thereof include G351 and G576 (trade names, manufactured by Nippon Zeon Co., Ltd.); VINYBLAN 240, 270, 277, 375, 386, 609, 550, 601, 602, 630, 660, 671, 683, 680, 680S, 681N, 685R, 277, 380, 381, 410, 430, 432, 860, 863, 865, 867, 900, 900GT, 938 and 950 (trade names, manufactured by Nissin Chemical Industry Co., Ltd.).

These latex polymers may be used singly, or two or more of these polymers may be blended, if necessary.

In the receptor layer for use in the present invention, a ratio of the copolymer latex comprising a monomer unit of vinyl chloride occupying the whole solid content in the layer is preferably 50% or more.

In the present invention, it is preferable to prepare the receptor layer by applying an aqueous type coating solution and then drying it. The "aqueous type" so-called here means that 60% by mass or more of the solvent (dispersion medium) of the coating solution is water. As components other than water in the coating solution, water miscible organic solvents may be used, such as methyl alcohol, ethyl alcohol, isopropyl alcohol, methyl cellosolve, ethyl cellosolve, dimethylformamide, ethyl acetate, diacetone alcohol, furfuryl alcohol, benzyl alcohol, diethylene glycol monoethyl ether, and oxyethyl phenyl ether.

The polymer latex for use in the present invention preferably has a minimum film-forming temperature (MFT) of from −30 to 90° C., more preferably from 0 to 70° C. In order to control the minimum film-forming temperature, a film-forming aid may be added. The film-forming aid is also called a temporary plasticizer, and it is an organic compound (usually an organic solvent) that reduces the minimum film-forming temperature of the polymer latex. It is described in, for example, Souichi Muroi, "Gosei Latex no Kagaku (Chemistry of Synthetic Latex)", issued by Kobunshi Kanko Kai (1970). Preferable examples of the film-forming aid are listed below, but the compounds that can be used in the invention are not limited to the following specific examples.

Z-1: Benzyl alcohol

Z-2: 2,2,4-Trimethylpentanediol-1,3-monoisobutyrate

Z-3: 2-Dimethylaminoethanol

Z-4: Diethylene glycol

The polymer latex used in the present invention may be used (blended) with another polymer latex. Preferable examples of the another polymer latex include polylactates, polyurethanes, polycarbonates, polyesters, polyacetals, and SBR's. Among these, polyesters and polycarbonates are preferable.

In combination with the above-described polymer latex for use in the present invention, any polymer can be used. The polymer that can be used in combination is preferably transparent or translucent, and generally colorless. The polymer may be a natural resin, polymer, or copolymer; a synthetic resin, polymer, or copolymer; or another film-forming medium; and specific examples include gelatins, polyvinyl alcohols, hydroxyethylcelluloses, cellulose acetates, cellulose acetate butyrates, polyvinylpyrrolidones, caseins, starches, polyacrylic acids, polymethylmethacrylic acids, polyvinyl chlorides, polymethacrylic acids, styrene-maleic anhydride copolymers, styrene-acrylonitrile copolymers, styrene-butadiene copolymers, polyvinyl acetals (e.g. polyvinyl formals, polyvinyl butyrals, etc.), polyesters, polyurethanes, phenoxy resins, polyvinylidene chlorides, polyepoxides, polycarbonates, polyvinyl acetates, polyolefins, and polyamides. In the coating liquid, a binder may be dissolved or dispersed in an aqueous solvent or in an organic solvent, or may be in the form of an emulsion.

The glass transition temperature (Tg) of the binder for use in the invention is preferably in the range of −30° C. to 70° C., more preferably −10° C. to 50° C., still more preferably 0° C. to 40° C., in view of film-forming properties (brittleness for working) and image storability. A blend of two or more types of polymers can be used as the binder. When a blend of two or more polymers is used, the average Tg obtained by summing up the Tg of each polymer weighted by its proportion, is preferably within the foregoing range. Also, when phase separation occurs or when a core-shell structure is adopted, the weighted average Tg is preferably within the foregoing range.

The glass transition temperature (Tg) is calculated according to the following equation:

$$1/Tg=\Sigma(Xi/Tgi)$$

wherein, assuming that the polymer is a copolymer composed of n monomers from i=1 to i=n, Xi is a weight fraction of the i-th monomer ($\Sigma Xi=1$) and Tgi is glass transition temperature (measured in absolute temperature) of a homopolymer formed from the i-th monomer. The symbol Σ means the sum of i=1 to i=n. The value of the glass transition temperature of a homopolymer formed from each monomer (Tgi) is adopted from J. Brandrup and E. H. Immergut, "Polymer Handbook, 3rd. Edition", Wiley-Interscience (1989).

The polymer used for the binder for use in the present invention can be easily obtained by a solution polymerization method, a suspension polymerization method, an emulsion polymerization method, a dispersion polymerization method, an anionic polymerization method, a cationic polymerization method, or the like. Above all, an emulsion polymerization method in which the polymer is obtained as a latex is the most preferable. Also, a method is preferable in which the polymer is prepared in a solution, and the solution is neutralized, or an emulsifier is added to the solution, to which water is then added, to prepare an aqueous dispersion by forced stirring. For example, an emulsion polymerization method comprises conducting polymerization under stirring at about 30° C. to about 100° C. (preferably 60° C. to 90° C.) for 3 to 24 hours by using water or a mixed solvent of water and a water-miscible organic solvent (such as methanol, ethanol, or acetone) as a dispersion medium, a monomer mixture in an amount of 5 mass % to 150 mass % based on the amount of the dispersion medium, an emulsifier and a polymerization initiator. Various conditions such as the dispersion medium, the monomer concentration, the amount of initiator, the amount of emulsifier, the amount of dispersant, the reaction temperature, and the method for adding monomers are suitably determined considering the type of the monomers to be used. Furthermore, it is preferable to use a dispersant when necessary.

Generally, the emulsion polymerization method can be conducted according to the disclosures of the following documents: "Gosei Jushi Emarujon (Synthetic Resin Emulsions)" (edited by Taira Okuda and Hiroshi Inagaki and published by Kobunshi Kankokai (1978)); "Gosei Ratekkusu no Oyo (Applications of Synthetic Latexes)" (edited by Takaaki Sugimura, Yasuo Kataoka, Soichi Suzuki, and Keiji Kasahara and published by Kobunshi Kankokai (1993)); and "Gosei Ratekkusu no Kagaku (Chemistry of Synthetic Latexes)" (edited by Soichi Muroi and published by Kobunshi Kankokai (1970)). The emulsion polymerization method for synthesizing the polymer latex for use in the present invention may be a batch polymerization method, a monomer (continuous or divided) addition method, an emulsion addition method, or a seed polymerization method. The emulsion polymerization method is preferably a batch polymerization method, a monomer (continuous or divided) addition method, or an emulsion addition method in view of the productivity of latex.

The polymerization initiator may be any polymerization initiator having radical generating ability. The polymerization initiator to be used may be selected from inorganic peroxides such as persulfates and hydrogen peroxide, peroxides described in the organic peroxide catalogue of NOF Corporation, and azo compounds as described in the azo polymerization initiator catalogue of Wako Pure Chemical Industries, Ltd. Among them, water-soluble peroxides such as persulfates and water-soluble azo compounds as described in the azo polymerization initiator catalogue of Wako Pure Chemical Industries, Ltd. are preferable; ammonium persulfate, sodium persulfate, potassium persulfate, azobis(2-methylpropionamidine) hydrochloride, azobis(2-methyl-N-(2-hydroxyethyl)propionamide), and azobiscyanovaleric acid are more preferable; and peroxides such as ammonium persulfate, sodium persulfate, and potassium persulfate are especially preferable from the viewpoints of image storability, solubility, and cost.

The amount of the polymerization initiator to be added is, based on the total amount of monomers, preferably 0.3 mass % to 2.0 mass %, more preferably 0.4 mass % to 1.75 mass %, and especially preferably 0.5 mass % to 1.5 mass %.

The polymerization emulsifier to be used may be selected from anionic surfactants, nonionic surfactants, cationic surfactants, and ampholytic surfactants. Among them, anionic surfactants are preferable from the viewpoints of dispersibility and image storability. Sulfonic acid type anionic surfactants are more preferable because polymerization stability can be ensured even with a small addition amount and they have resistance to hydrolysis. Long chain alkyldiphenyl ether disulfonic acid salts (whose typical example is PELEX SS-H manufactured by Kao Corporation, trade name) are still more preferable, and low electrolyte types such as PIONIN A-43-S (manufactured by Takemoto Oil & Fat Co., Ltd., trade name) are especially preferable.

The amount of sulfonic acid type anionic surfactant as the polymerization emulsifier is preferably 0.1 mass % to 10.0 mass %, more preferably 0.2 mass % to 7.5 mass %, and especially preferably 0.3 mass % to 5.0 mass %, based on the total amount of monomers.

It is preferable to use a chelating agent in synthesizing the polymer latex to be used in the present invention. The chelating agent is a compound capable of coordinating (chelating) a polyvalent ion such as metal ion (e.g., iron ion) or alkaline earth metal ion (e.g., calcium ion), and examples of the chelate compound which can be used include the compounds described in JP-B-6-8956 ("JP-B" means examined Japanese patent publication), U.S. Pat. No. 5,053,322, JP-A-4-73645, JP-A-4-127145, JP-A-4-247073, JP-A-4-305572, JP-A-6-11805, JP-A-5-173312, JP-A-5-66527, JP-A-5-158195, JP-A-6-118580, JP-A-6-110168, JP-A-6-161054, JP-A-6-175299, JP-A-6-214352, JP-A-7-114161, JP-A-7-114154, JP-A-7-120894, JP-A-7-199433, JP-A-7-306504, JP-A-9-43792, JP-A-8-314090, JP-A-10-182571, JP-A-10-182570, and JP-A-11-190892.

Preferred examples of the chelating agent include inorganic chelate compounds (e.g., sodium tripolyphosphate, sodium hexametaphosphate, sodium tetrapolyphosphate), aminopolycarboxylic acid-based chelate compounds (e.g., nitrilotriacetate, ethylenediaminetetraacetate), organic phosphonic acid-based chelate compounds (e.g., compounds described in Research Disclosure, No. 18170, JP-A-52-102726, JP-A-53-42730, JP-A-56-97347, JP-A-54-121127, JP-A-55-4024, JP-A-55-4025, JP-A-55-29883, JP-A-55-126241, JP-A-55-65955, JP-A-55-65956, JP-A-57-179843, JP-A-54-61125, and West German Patent No. 1045373), polyphenol-based chelating agents, and polyamine-based chelate compounds, with aminopolycarboxylic acid derivatives being particularly preferred.

Preferred examples of the aminopolycarboxylic acid derivative include the compounds shown in the Table attached to "EDTA (-Complexane no Kagaku-) (EDTA-Chemistry of Complexane-)", Nankodo (1977). In these compounds, a part of the carboxyl groups may be substituted by an alkali metal salt such as sodium or potassium or by an ammonium salt. More preferred examples of the aminopolycarboxylic acid derivative include iminodiacetic acid, N-methyliminodiacetic acid, N-(2-aminoethyl)iminodiacetic acid, N-(carbamoylmethyl)imino diacetic acid, nitrilotriacetic acid, ethylenediamine-N,N'-diacetic acid, ethylenediamine-N,N'-di-α-propionic acid, ethylenediamine-N,N'-di-β-propionic acid, N,N'-ethylene-bis(α-o-hydroxyphenyl)glycine, N,N'-di(2-hydroxybenzyl)ethylenediamine-N,N'-diacetic acid, ethylenediamine-N,N'-diacetic acid-N,N'-diacetohydroxamic acid, N-hydroxyethylethylenediamine-N,N',N'-triacetic acid, ethylenediamine-N,N,N',N'-tetraacetic acid, 1,2-propylenediamine-N,N,N',N'-tetraacetic acid, d,1-2,3-diaminobutane-N,N,N',N'-tetraacetic acid, meso-2,3-diaminobutane-N,N,N',N'-tetraacetic acid, 1-phenylethylenediamine-N,N,N',N'-tetraacetic acid, d,1-1,2-diphenylethylenediamine-N,N,N',N'-tetraacetic acid, 1,4-diaminobutane-N,N,N',N'-tetraacetic acid, trans-cyclobutane-1,2-diamine-N,N,N',N'-tetraacetic acid, trans-cyclopentane-1,2-diamine-N,N,N',N'-tetraacetic acid, trans-cyclohexane-1,2-diamine-N,N,N',N'-tetraacetic acid, cis-cyclohexane-1,2-diamine-N,N,N',N'-tetraacetic acid, cyclohexane-1,3-diamine-N,N,N',N'-tetraacetic acid, cyclohexane-1,4-diamine-N,N,N',N'-tetraacetic acid, o-phenylenediamine-N,N,N',N'-tetraacetic acid, cis-1,4-diaminobutene-N,N,N',N'-tetraacetic acid, trans-1,4-diaminobutene-N,N,N',N'-tetraacetic acid, α,α'-diamino-o-xylene-N,N,N',N'-tetraacetic acid, 2-hydroxy-1,3-propanediamine-N,N,N',N'-tetraacetic acid, 2,2'-oxy-bis(ethyliminodiacetic acid), 2,2'-ethylenedioxy-bis(ethyliminodiacetic acid), ethylenediamine-N,N'-diacetic acid-N,N'-di-α-propionic acid, ethylenediamine-N,N'-diacetic acid-N,N'-di-β-propionic acid, ethylenediamine-N,N,N',N'-tetrapropionic acid, diethylenetriamine-N,N,N',N",N"-pentaacetic acid, triethylenetetramine-N,N,N',N",N'",N'"-hexaacetic acid, and 1,2,3-triaminopropane-N,N,N',N",N'",N'"-hexaacetic acid. In these compounds, a part of the carboxyl groups may be substituted by an alkali metal salt such as sodium or potassium or by an ammonium salt.

The amount of the chelating agent to be added is preferably 0.01 mass % to 0.4 mass %, more preferably 0.02 mass % to 0.3 mass %, and especially preferably 0.03 mass % to 0.15 mass %, based on the total amount of monomers. When the addition amount of the chelating agent is too small, metal ions entering during the preparation of the polymer latex are not sufficiently trapped, and the stability of the latex against aggregation is lowered, whereby the coating properties become worse. When the amount is too large, the viscosity of the latex increases, whereby the coating properties are lowered.

In the preparation of the polymer latex to be used in the present invention, it is preferable to use a chain transfer agent. As the chain transfer agent, ones described in Polymer Handbook (3rd Edition) (Wiley-Interscience, 1989) are preferable. Sulfur compounds are more preferable because they have high chain-transfer ability and because the required amount is small. Especially, hydrophobic mercaptane-based chain transfer agents such as tert-dodecylmercaptane and n-dodecylmercaptane are preferable.

The amount of the chain transfer agent to be added is preferably 0.2 mass % to 2.0 mass %, more preferably 0.3 mass % to 1.8 mass %, and especially preferably 0.4 mass % to 1.6 mass %, based on the total amount of monomers.

Besides the foregoing compounds, in the emulsion polymerization, use can be made of additives, such as electrolytes, stabilizers, thickeners, defoaming agents, antioxidants, vulcanizers, antifreezing agents, gelling agents, and vulcanization accelerators, as described, for example, in Synthetic Rubber Handbook.

In the coating solution of the polymer latex to be used in the present invention, an aqueous solvent can be used as the solvent, and a water-miscible organic solvent may optionally be used in combination. Examples of the water-miscible organic solvent include alcohols (for example, methyl alcohol, ethyl alcohol, and propyl alcohol), cellosolves (for example, methyl cellosolve, ethyl cellosolve, and butyl cellosolve), ethyl acetate, and dimethylformamide. The amount of the organic solvent to be added is preferably 50 mass % or less of the entire solvent, more preferably 30 mass % or less of the entire solvent.

Furthermore, in the polymer latex to be used in the present invention, the polymer concentration is, based on the amount of the latex liquid, preferably 10 mass % to 70 mass %, more preferably 20 mass % to 60 mass %, and especially preferably 30 mass % to 55 mass %.

The polymer latex in the image-receiving sheet used in the present invention includes a state of a gel or dried film formed by removing a part of solvents by drying after coating.

<Water-soluble Polymer>

At least one of layers, particularly the receptor layer, of the heat-sensitive transfer image-receiving sheet preferably contains a water-soluble polymer. Herein, the "water-soluble polymer" means a polymer which dissolves, in 100 g water at 20° C., in an amount of preferably 0.05 g or more, more preferably 0.1 g or more, further preferably 0.5 g or more, and particularly preferably 1 g or more. The water-soluble polymer which can be used in the present invention is natural polymers (polysaccharide type, microorganism type, and animal type), semi-synthetic polymers (cellulose-based, starch-based, and alginic acid-based), and synthetic polymer type (vinyl type and others); and synthetic polymers including polyvinyl alcohols, and natural or semi-synthetic polymers using celluloses derived from plant as starting materials, which will be explained later, correspond to the water-soluble polymer usable in the present invention. The latex polymers recited above are not included in the water-soluble polymers which can be used in the present invention.

Among the water-soluble polymers which can be used in the present invention, the natural polymers and the semi-synthetic polymers will be explained in detail. Specific examples include the following polymers: plant type polysaccharides such as gum arabics, κ-carrageenans, ι-carrageenans, λ-carrageenans, guar gums (e.g. Supercol, manufactured by Squalon), locust bean gums, pectins, tragacanths, corn starches (e.g. Purity-21, manufactured by National Starch & Chemical Co.), and phosphorylated starches (e.g. National 78-1898, manufactured by National Starch & Chemical Co.); microbial type polysaccharides such as xanthan gums (e.g. Keltrol T, manufactured by Kelco) and dextrins (e.g. Nadex 360, manufactured by National Starch & Chemical Co.); animal type natural polymers such as gelatins (e.g. Crodyne B419, manufactured by Croda), caseins, sodium chondroitin sulfates (e.g. Cromoist CS, manufactured by Croda); cellulose-based polymers such as ethylcelluloses (e.g. Cellofas WLD, manufactured by I.C.I.), carboxymethylcelluloses (e.g. CMC, manufactured by Daicel), hydroxyethylcelluloses (e.g. HEC, manufactured by Daicel), hydroxypropylcelluloses (e.g. Klucel, manufactured by Aqualon), methylcelluloses (e.g. Viscontran, manufactured by Henkel), nitrocelluloses (e.g. Isopropyl Wet manufactured by Hercules), and cationated celluloses (e.g. Crodacel QM, manufactured by Croda); starches such as phosphorylated starches (e.g. National 78-1898, manufactured by National Starch & Chemical Co.); alginic acid-based compounds such as sodium alginates (e.g. Keltone, manufactured by Kelco) and propylene glycol alginates; and other polymers such as cationated guar gums (e.g. Hi-care 1000, manufactured by Alcolac) and sodium hyaluronates (e.g. Hyalure, manufactured by Lifecare Biomedial) (all of the names are trade names).

Gelatin is one of preferable embodiments in the present invention. Gelatin having a molecular weight of from 10,000 to 1,000,000 may be used in the present invention. Gelatin that can be used in the present invention may contain an anion such as $Cl^-$ and $SO_4^{2-}$, or alternatively a cation such as $Fe^{2+}$, $Ca^{2+}$, $Mg^{2+}$, $Sn^{2+}$ and $Zn^{2+}$. Gelatin is preferably added as a water solution.

Among the water-soluble polymers which can be used in the present invention, the synthetic polymers will be explained in detail. Examples of the acryl type include sodium polyacrylates, polyacrylic acid copolymers, polyacrylamides, polyacrylamide copolymers, and polydiethylaminoethyl(meth)acrylate quaternary salts or their copolymers. Examples of the vinyl type include polyvinylpyrrolidones, polyvinylpyrrolidone copolymers, and polyvinyl alcohols. Examples of the others include polyethylene glycols, polypropylene glycols, polyisopropylacrylamides, polymethyl vinyl ethers, polyethyleneimines, polystyrenesulfonic acids or their copolymers, naphthalenesulfonic acid condensate salts, polyvinylsulfonic acids or their copolymers, polyacrylic acids or their copolymers, acrylic acid or its copolymers, maleic acid copolymers, maleic acid monoester copolymers, acryloylmethylpropanesulfonic acid or its copolymers, polydimethyldiallylammonium chlorides or their copolymers, polyamidines or their copolymers, polyimidazolines, dicyanamide type condensates, epichlorohydrin/dimethylamine condensates, Hofmann decomposed products of polyacrylamides, and water-soluble polyesters (Plascoat Z-221, Z-446, Z-561, Z-450, Z-565, Z-850, Z-3308, RZ-105, RZ-570, Z-730 and RZ-142 (all of these names are trade names), manufactured by Goo Chemical Co., Ltd.).

In addition, highly-water-absorptive polymers, namely, homopolymers of vinyl monomers having —COOM or —$SO_3M$ (M represents a hydrogen atom or an alkali metal) or copolymers of these vinyl monomers among them or with other vinyl monomers (for example, sodium methacrylate, ammonium methacrylate, Sumikagel L-5H (trade name) manufactured by Sumitomo Chemical Co., Ltd.) as described in, for example, U.S. Pat. No. 4,960,681 and JP-A-62-245260, may also be used.

Preferred water-soluble synthetic polymers that can be used in the present invention are polyvinyl alcohols.

The polyvinyl alcohols are explained in detail below.

Examples of completely saponificated polyvinyl alcohol include PVA-105 [polyvinyl alcohol (PVA) content: 94.0 mass % or more; degree of saponification: 98.5±0.5 mol %; content of sodium acetate: 1.5 mass % or less; volatile constituent: 5.0 mass % or less; viscosity (4 mass %; 20° C.): 5.6±0.4 CPS]; PVA-110 [PVA content: 94.0 mass %; degree of saponification: 98.5±0.5 mol %; content of sodium acetate: 1.5 mass %; volatile constituent: 5.0 mass %; viscosity (4 mass %; 20° C.): 11.0±0.8 CPS]; PVA-117 [PVA content: 94.0 mass %; degree of saponification: 98.5±0.5 mol %; content of sodium acetate: 1.0 mass %; volatile constituent: 5.0 mass %; viscosity (4 mass %; 20° C.): 28.0±3.0 CPS]; PVA-117H [PVA content: 93.5 mass %; degree of saponification: 99.6±0.3 mol %; content of sodium acetate: 1.85 mass %; volatile constituent: 5.0 mass %; viscosity (4 mass %; 20° C.): 29.0±3.0 CPS]; PVA-120 [PVA content: 94.0 mass %;

degree of saponification: 98.5±0.5 mol %; content of sodium acetate: 1.0 mass %; volatile constituent: 5.0 mass %; viscosity (4 mass %; 20° C.): 39.5±4.5 CPS]; PVA-124 [PVA content: 94.0 mass %; degree of saponification: 98.5±0.5 mol %; content of sodium acetate: 1.0 mass %; volatile constituent: 5.0 mass %; viscosity (4 mass %; 20° C.): 60.0±6.0 CPS]; PVA-124H [PVA content: 93.5 mass %; degree of saponification: 99.6±0.3 mol %; content of sodium acetate: 1.85 mass %; volatile constituent: 5.0 mass %; viscosity (4 mass %; 20° C.): 61.0±6.0 CPS]; PVA-CS [PVA content: 94.0 mass %; degree of saponification: 97.5±0.5 mol %; content of sodium acetate: 1.0 mass %; volatile constituent: 5.0 mass %; viscosity (4 mass %; 20° C.): 27.5±3.0 CPS]; PVA-CST [PVA content: 94.0 mass %; degree of saponification: 96.0±0.5 mol %; content of sodium acetate: 1.0 mass %; volatile constituent: 5.0 mass %; viscosity (4 mass %; 20° C.): 27.0±3.0 CPS]; and PVA-HC [PVA content: 90.0 mass %; degree of saponification: 99.85 mol % or more; content of sodium acetate: 2.5 mass %; volatile constituent: 8.5 mass %; viscosity (4 mass %; 20° C.): 25.0±3.5 CPS] (all trade names, manufactured by Kuraray Co., Ltd.), and the like.

Examples of partially saponificated polyvinyl alcohol include PVA-203 [PVA content: 94.0 mass %; degree of saponification: 88.0±1.5 mol %; content of sodium acetate: 1.0 mass %; volatile constituent: 5.0 mass %; viscosity (4 mass %; 20° C.): 3.4±0.2 CPS]; PVA-204 [PVA content: 94.0 mass %; degree of saponification: 88.0±1.5 mol %; content of sodium acetate: 1.0 mass %; volatile constituent: 5.0 mass %; viscosity (4 mass %; 20° C.): 3.9±0.3 CPS]; PVA-205 [PVA content: 94.0 mass %; degree of saponification: 88.0±1.5 mol %; content of sodium acetate: 1.0 mass %; volatile constituent: 5.0 mass %; viscosity (4 mass %; 20° C.): 5.0±0.4 CPS]; PVA-210 [PVA content: 94.0 mass %; degree of saponification: 88.0±1.0 mol %; content of sodium acetate: 1.0 mass %; volatile constituent: 5.0 mass %; viscosity (4 mass %; 20° C.): 9.0±1.0 CPS]; PVA-217 [PVA content: 94.0 mass %; degree of saponification: 88.0±1.0 mol %; content of sodium acetate: 1.0 mass %; volatile constituent: 5.0 mass %; viscosity (4 mass %; 20° C.): 22.5±2.0 CPS]; PVA-220 [PVA content: 94.0 mass %; degree of saponification: 88.0±1.0 mol %; content of sodium acetate: 1.0 mass %; volatile constituent: 5.0 mass %; viscosity (4 mass %; 20° C.): 30.0±3.0 CPS]; PVA-224 [PVA content: 94.0 mass %; degree of saponification: 88.0±1.5 mol %; content of sodium acetate: 1.0 mass %; volatile constituent: 5.0 mass %; viscosity (4 mass %; 20° C.): 44.0±4.0 CPS]; PVA-228 [PVA content: 94.0 mass %; degree of saponification: 88.0±1.5 mol %; content of sodium acetate: 1.0 mass %; volatile constituent: 5.0 mass %; viscosity (4 mass %; 20° C.): 65.0±5.0 CPS]; PVA-235 [PVA content: 94.0 mass %; degree of saponification: 88.0±1.5 mol %; content of sodium acetate: 1.0 mass %; volatile constituent: 5.0 mass %; viscosity (4 mass %; 20° C.): 95.0±15.0 CPS]; PVA-217EE [PVA content: 94.0 mass %; degree of saponification: 88.0±1.0 mol %; content of sodium acetate: 1.0 mass %; volatile constituent: 5.0 mass %; viscosity (4 mass %; 20° C.): 23.0±3.0 CPS]; PVA-217E [PVA content: 94.0 mass %; degree of saponification: 88.0±1.0 mol %; content of sodium acetate: 1.0 mass %; volatile constituent: 5.0 mass %; viscosity (4 mass %; 20° C.): 23.0±3.0 CPS]; PVA-220E [PVA content: 94.0 mass %; degree of saponification: 88.0±1.0 mol %; content of sodium acetate: 1.0 mass %; volatile constituent: 5.0 mass %; viscosity (4 mass %; 20° C.): 31.0±4.0 CPS]; PVA-224E [PVA content: 94.0 mass %; degree of saponification: 88.0±1.0 mol %; content of sodium acetate: 1.0 mass %; volatile constituent: 5.0 mass %; viscosity (4 mass %; 20° C.): 45.0±5.0 CPS]; PVA-403 [PVA content: 94.0 mass %; degree of saponification: 80.0±1.5 mol %; content of sodium acetate: 1.0 mass %; volatile constituent: 5.0 mass %; viscosity (4 mass %; 20° C.): 3.1±0.3 CPS]; PVA-405 [PVA content: 94.0 mass %; degree of saponification: 81.5±1.5 mol %; content of sodium acetate: 1.0 mass %; volatile constituent: 5.0 mass %; viscosity (4 mass %; 20° C.): 4.8±0.4 CPS]; PVA-420 [PVA content: 94.0 mass %; degree of saponification: 79.5±1.5 mol %; content of sodium acetate: 1.0 mass %; volatile constituent: 5.0 mass %]; PVA-613 [PVA content: 94.0 mass %; degree of saponification: 93.5±1.0 mol %; content of sodium acetate: 1.0 mass %; volatile constituent: 5.0 mass %; viscosity (4 mass %; 20° C.): 16.5±2.0 CPS]; L-8 [PVA content: 96.0 mass %; degree of saponification: 71.0±1.5 mol %; content of sodium acetate: 1.0 mass % (ash); volatile constituent: 3.0 mass %; viscosity (4 mass %; 20° C.): 5.4±0.4 CPS] (all trade names, manufactured by Kuraray Co., Ltd.), and the like.

The above values were measured in the manner described in JIS K-6726-1977.

With respect to modified polyvinyl alcohols, those described in Koichi Nagano, et al., "Poval", Kobunshi Kankokai, Inc. are useful. The modified polyvinyl alcohols include polyvinyl alcohols modified by cations, anions, —SH compounds, alkylthio compounds, or silanols.

Examples of such modified polyvinyl alcohols (modified PVA) include C polymers such as C-118, C-318, C-318-2A, and C-506 (all being trade names of Kuraray Co., Ltd.); HL polymers such as HL-12E and HL-1203 (all being trade names of Kuraray Co., Ltd.); HM polymers such as HM-03 and HM-N-03 (all being trade names of Kuraray Co., Ltd.); K polymers such as KL-118, KL-318, KL-506, KM-118T, and KM-618 (all being trade names of Kuraray Co., Ltd.); M polymers such as M-115 (a trade name of Kuraray co., Ltd.); MP polymers such as MP-102, MP-202, and MP-203 (all being trade names of Kuraray Co., Ltd.); MPK polymers such as MPK-1, MPK-2, MPK-3, MPK-4, MPK-5, and MPK-6 (all being trade names of Kuraray Co., Ltd.); R polymers such as R-1130, R-2105, and R-2130 (all being trade names of Kuraray Co., Ltd.); and V polymers such as V-2250 (a trade name of Kuraray Co., Ltd.).

The viscosity of polyvinyl alcohol can be adjusted or stabilized by adding a trace amount of a solvent or an inorganic salt to an aqueous solution of polyvinyl alcohol, and there can be employed compounds described in the aforementioned reference "Poval", Koichi Nagano et al., published by Kobunshi Kankokai, pp. 144-154. For example, a coated surface quality can be improved by an addition of boric acid. The amount of boric acid added is preferably 0.01 to 40 mass % with respect to polyvinyl alcohol.

Preferred binders are transparent or semitransparent, generally colorless, and water-soluble. Examples include natural resins, polymers and copolymers; synthetic resins, polymers, and copolymers; and other media that form films: for example, rubbers, polyvinyl alcohols, hydroxyethyl celluloses, cellulose acetates, cellulose acetate butylates, polyvinylpyrrolidones, starches, polyacrylic acids, polymethyl methacrylates, polyvinyl chlorides, polymethacrylic acids, styrene/maleic acid anhydride copolymers, styrene/acrylonitrile copolymers, styrene/butadiene copolymers, polyvinylacetals (e.g., polyvinylformals and polyvinylbutyrals), polyesters, polyurethanes, phenoxy resins, polyvinylidene chlorides, polyepoxides, polycarbonates, polyvinyl acetates, polyolefins, cellulose esters, and polyamides.

In the present invention, preferred water-soluble polymers are polyvinyl alcohols and gelatin, with gelatin being most preferred.

An amount of the water-soluble polymer added to the receptor layer is preferably from 1 to 25% by mass, more preferably from 1 to 10% by mass based on the entire receptor layer.

<Crosslinking Agent>

The receptor layer preferably contains a crosslinking agent (compound capable of crosslinking a water-soluble polymer). It is preferable that the above-mentioned water-soluble polymer contained in the receptor layer is partly or entirely crosslinked with the crosslinking agent.

The crosslinking agent is required to have a plurarity of groups capable of reacting with an amino group, a carboxyl group, a hydroxyl group or the like, but the agent to be used may be suitably selected depending on the kind of the water-soluble polymer. Thus, there is no particular limitation for the kind of the crosslinking agent. It is suitable to use each of methods described in T. H. James; "THE THEORY OF THE PHOTOGRAPHIC PROCESS FOURTH EDITION", published by Macmillan Publishing Co., Inc. (1977), pp. 77 to 87, and crosslinking agents described in, for example, U.S. Pat. No. 4,678,739, col. 41; JP-A-59-116655, JP-A-62-245261, and JP-A-61-18942. Both crosslinking agents of an inorganic compound (e.g., chrome alum, boric acid and salts thereof) and crosslinking agents of an organic compound may be preferably used. Alternatively, the crosslinking agent to be used may be a mixture solution containing a chelating agent and a zirconium compound, whose pH is in the range of 1 to 7, as described in JP-A-2003-231775.

Specific examples of the crosslinking agent include epoxy-series compounds (e.g., diglycidyl ethyl ether, ethyleneglycol diglycidyl ether, 1,4-butanediol diglycidyl ether, 1,6-diglycidyl cyclohexane, N,N-diglycidyl-4-glycidyloxyaniline, sorbitol polyglycidyl ether, glycerol polyglycidyl ether, compounds described in JP-A-6-329877, JP-A-7-309954 and the like, and DIC FINE EM-60 (trade name, munufactured by DAINIPPON INK AND CHEMICALS, INCORPORATED)), aldehyde-series compounds (e.g., formaldehyde, glyoxal, gluralaldehyde), active halogen-series compounds (e.g., 2,4-dichloro-4-hydroxy-1,3,5-s-triazine, and compounds described in U.S. Pat. No. 3,325,287 and the like), active vinyl-series compounds (e.g., 1,3,5-trisacryloyl-hexahydro-s-triazine, bisvinylsulfonylmethyl ether, N,N'-ethylene-bis(vinylsulfonylactamido)ethane, and compounds described in JP-B-53-41220, JP-B-53-57257, JP-B-59-162546, JP-B-60-80846 and the like), mucohalogen acid compounds (e.g., mucochloric acid), N-carbamoylpyridinium salt compounds (e.g., (1-morpholinocarbonyl-3-pyridinio)methanesulfonate), haloamidinium salt compounds (e.g., 1-(1-chloro-1-pyridinomethylene)pyrrolidinium, 2-naphthalenesulfonate), N-methylol-series compounds (e.g., dimethylolurea, methyloldimethylhydantoin), carbodiimido compounds (e.g., polycarbodiimido compounds derived from isoholondiisocyanate as described in JP-A-59-187029 and JP-B-5-27450, carbodiimido compounds derived from tetramethylxylylene diisocyanate as described in JP-A-7-330849, multi-branch type carbodiimido compounds described in JP-A-10-30024, carbodiimido compounds derived from dicyclohexylmethane diisocyanate as described in JP-A-2000-7642, and CARBODILITE V-02, V-02-L2, V-04, V-06, E-01 and E-02 (trade names, manufactured by Nisshinbo Industries, Inc.)), oxazoline compounds (e.g., oxazoline compounds described in JP-A-2001-215653 and EPOCROS K-1010E, K-1020E, K-1030E, K-2010E, K-2020E, K-2030E, WS-500 and WS-700 (trade names, manufactured by NIPPON SHOKUBAI CO., LTD.)), isocyanate compounds (e.g., dispersible isocyanate compounds described in JP-A-7-304841, JP-A-8-277315, JP-A-10-45866, JP-A-9-71720, JP-A-9-328654, JP-A-9-104814, JP-A-2000-194045, JP-A-2000-194237 and JP-A-2003-64149, and Duranate WB40-100, WB40-80D, WT20-100 and WT30-100 (trade names, manufactured by Asahi Kasei Corporation), CR-60N (trade name, manufactured by DAINIPPON INK AND CHEMICALS, INCORPORATED)), polymer (high molecular) hardeners (e.g., compounds described in JP-A-62-234157 and the like); boric acid and salts thereof, borax, and alum.

Preferable compounds as the crosslinking agent include epoxy-series compounds, aldehyde-series compounds, active halogen-series compounds, active vinyl-series compounds, N-carbamoylpyridinium salt compounds, N-methylol-series compounds (e.g., dimethylolurea, methyloldimethylhydantoin), carbodiimido compounds, oxazoline compounds, isocyanate compounds, polymer hardeners (e.g., compounds described in JP-A-62-234157 and the like), boric acid and salts thereof, borax, and alum. More preferable crosslinking agent include epoxy-series compounds, active halogen-series compounds, active vinyl-series compounds, N-carbamoylpyridinium salt compounds, N-methylol-series compounds (e.g., dimethylolurea, methyloldimethylhydantoin), polymer hardeners (e.g., compounds described in JP-A-62-234157 and the like) and boric acid.

The above-mentioned crosslinking agent may be used singly or in combination of two or more.

The crosslinking agent that can be used in the present invention may be added to the water-soluble polymer solution in advance, or may be added at the last step for the preparation of the coating solution. Alternatively, the crosslinking agent may be added just before the coating.

The water-soluble polymer in the receptor layer is preferably cross-linked in a ratio of from 0.1 to 20 mass %, more preferably from 1 to 10 mass %, among the entire water-soluble polymer, even though the ratio varies depending on the kind of the crosslinking agent.

The addition amount of the crosslinking agent that can be used in the present invention varies depending on the kinds of the water-soluble binder and the crosslinking agent, but it is preferable that the amount is approximately in the range of from 0.1 to 50 mass parts, more preferably from 0.5 to 20 mass parts, and further more preferably from 1 to 10 mass parts, based on 100 mass parts of the water-soluble polymer contained in the constituting layer.

<Hardener>

A hardener that can used in the present invention as a crosslinking agent may be added in the coating layers (e.g., the receptor layer, the heat insulation layer, the undercoat layer) of the image-receiving layer.

Examples of hardener that can be used in the present invention include H-1, 4, 6, 8, and 14 in JP-A-1-214845, page 17; compounds (H-1 to H-54) represented by one of the formulae (VII) to (XII) in U.S. Pat. No. 4,618,573, columns 13 to 23; compounds (H-1 to H-76) represented by the formula (6) in JP-A-2-214852, page 8, the lower right (particularly, H-14); and compounds described in Claim 1 in U.S. Pat. No. 3,325,287. Examples of the hardening agent include hardening agents described, for example, in U.S. Pat. No. 4,678,739, column 41, U.S. Pat. No. 4,791,042, JP-A-59-116655, JP-A-62-245261, JP-A-61-18942, and JP-A-4-218044. More specifically, an aldehyde-series hardening agent (formaldehyde, etc.), an aziridine-series hardening agent, an epoxy-series hardening agent, a vinyl sulfone-series hardening agent (N,N'-ethylene-bis(vinylsulfonylacetamido)ethane, etc.), an N-methylol-series hardening agent (dimethylol urea, etc.), a boric acid, a metaboric acid, or a polymer hardening agent (compounds described, for example, in JP-A-62-234157), can be mentioned.

Preferable examples of the hardener include a vinylsulfone-series hardener and chlorotriazines.

More preferable hardeners in the present invention are compounds represented by the following Formula (1B) or (1C).

$(CH_2{=}CH{-}SO_2)_{n1}\text{-}L$ Formula (1B)

$(X{-}CH_2{-}CH_2{-}SO_2)_{n1}\text{-}L$ Formula (1C)

In formulae (1B) and (1C), X represents a halogen atom, L represents an organic linking group having n1-valency. When the compound represented by formula (B1) or (C1) is a low-molecular compound, n1 denotes an integer of from 1 to 4. When the compound represented by formula (B1) or (C1) is a high-molecular (polymer) compound, L represents an organic linking group containing a polymer chain and n1 denotes an integer ranging from 10 to 1,000.

In the Formulae (1B) and (1C), X is preferably a chlorine atom or a bromine atom, and further preferably a bromine atom. n1 is an integer of from 1 to 4, preferably an integer from 2 to 4, more preferably 2 or 3 and most preferably 2.

L represents an organic group having n1-valency, and preferably an aliphatic hydrocarbon group, an aromatic hydrocarbon group or a heterocyclic group, provided that these groups may be combined through an ether bond, ester bond, amide bond, sulfonamide bond, urea bond, urethane bond or the like. Also, each of these groups may be further substituted. Examples of the substituent include a halogen atom, alkyl group, aryl group, heterocyclic group, hydroxyl group, alkoxy group, aryloxy group, alkylthio group, arylthio group, acyloxy group, alkoxycarbonyl group, carbamoyloxy group, acyl group, acyloxy group, acylamino group, sulfonamide group, carbamoyl group, sulfamoyl group, sulfonyl group, phosphoryl group, carboxyl group and sulfo group. Among these groups, a halogen atom, alkyl group, hydroxy group, alkoxy group, aryloxy group and acyloxy group are preferable.

Specific examples of the vinylsulfone-series hardener include, though not limited to, the following compounds (VS-1) to (VS-27).

(VS-1)

$CH_2{=}CH{-}SO_2{-}CH_2{-}SO_2{-}CH{=}CH_2$ (VS-2)

$CH_2{=}CH{-}SO_2{-}CH_2CH_2{-}SO_2{-}CH{=}CH_2$ (VS-3)

$CH_2{=}CH{-}SO_2{-}CH_2CH_2CH_2{-}SO_2{-}CH{=}CH_2$ (VS-4)

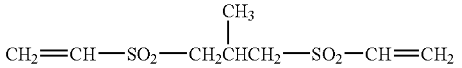

(VS-5)

$CH_2{=}CH{-}SO_2{-}CH_2OCH_2{-}SO_2{-}CH{=}CH_2$ (VS-6)

$CH_2{=}CH{-}SO_2{-}CH_2CH_2OCH_2CH_2{-}SO_2{-}CH{=}CH_2$ (VS-7)

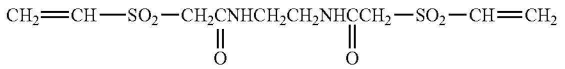

(VS-8)

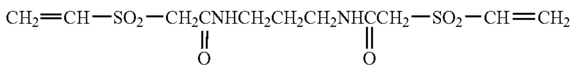

-continued (VS-9)

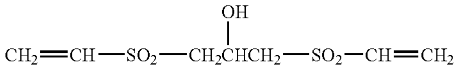

(VS-10)

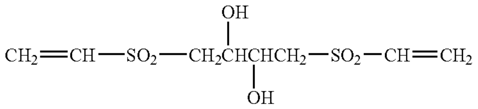

(VS-11)

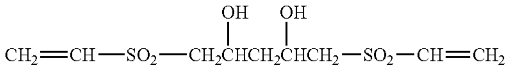

(VS-12)

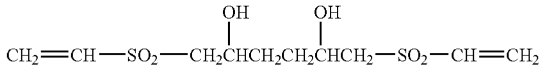

(VS-13)

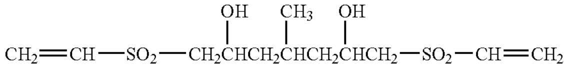

(VS-14)

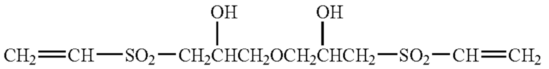

(VS-15)

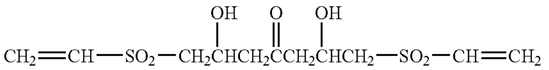

(VS-16)

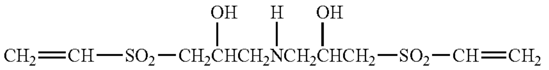

(VS-17)

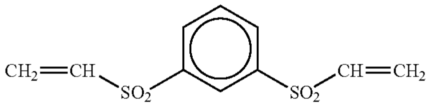

(VS-18)

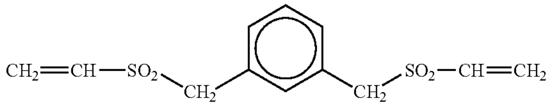

(VS-19)

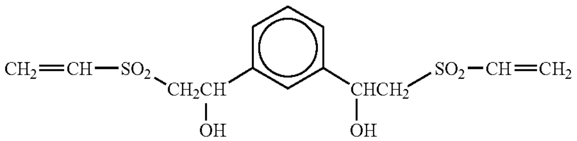

(VS-20)

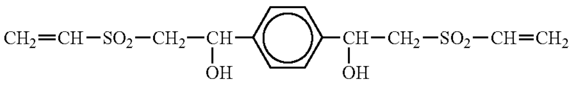

(VS-21)

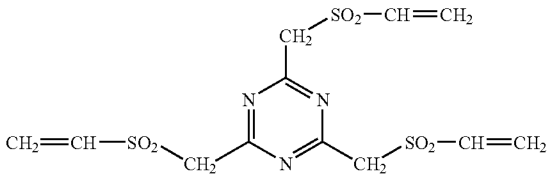

-continued (VS-22)

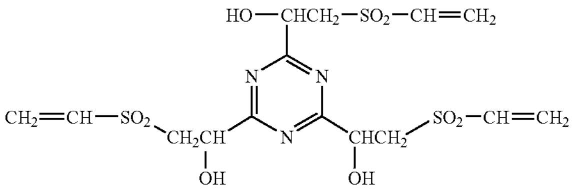

(VS-23)

$Cl-CH_2-CH_2-SO_2-CH_2-SO_2-CH_2-CH_2-Cl$ (VS-24)

$Br-CH_2-CH_2-SO_2-CH_2-SO_2-CH_2-CH_2-Br$ (VS-25)

$Br-CH_2-CH_2-SO_2-CH_2OCH_2-SO_2-CH_2-CH_2-Br$ (VS-26)

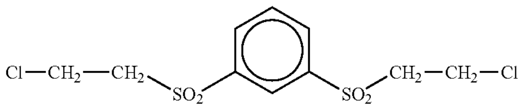

(VS-27)

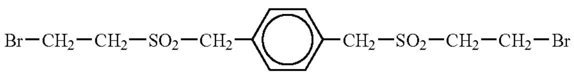

These hardeners may be obtained with reference to the method described in, for example, the specification of U.S. Pat. No. 4,173,481.

Also, as the chlorotriazine-series hardener, 1,3,5-triazine compounds in which the 2nd position, 4th position or 6th position of the compound is substituted with at least one chlorine atom are preferable. 1,3,5-triazine compounds in which the 2nd position, 4th position or 6th position of the compound is substituted with two or three chlorine atoms are more preferable.

The 2nd position, 4th position or 6th position of the compound may be substituted with at least one chlorine atom and the remainder positions may be substituted with groups other than a chlorine atom. Examples of these other groups include a hydrogen atom, bromine atom, fluorine atom, iodine atom, alkyl group, alkenyl group, alkynyl group, cycloalkyl group, cycloalkenyl group, aryl group, heterocyclic group, hydroxy group, nitro group, cyano group, amino group, hydroxylamino group, alkylamino group, arylamino group, heterocyclic amino group, acylamino group, sulfonamide group, carbamoyl group, sulfamoyl group, sulfo group, carboxyl group, alkoxy group, alkenoxy group, aryloxy group, heterocyclic oxy group, acyl group, acyloxy group, alkyl- or aryl-sulfonyl group, alkyl- or aryl-sulfinyl group, alkyl- or aryl-sulfonyloxy group, mercapto group, alkylthio group, alkenylthio group, arylthio group, heterocyclic thio group and alkyloxy- or aryloxy-carbonyl group.

Specific examples of the chlorotriazine-series hardener include, though not limited to, 4,6-dichloro-2-hydroxy-1,3,5-triazine or its Na salt, 2-chloro-4,6-diphenoxytriazine, 2-chloro-4,6-bis[2,4,6-trimethylphenoxy]triazine, 2-chloro-4,6-diglycidoxy-1,3,5-triazine, 2-chloro-4-(n-butoxy)-6-glycidoxy-1,3,5-triazine, 2-chloro-4-(2,4,6-trimethylphenoxy)-6-glycidoxy-1,3,5-triazine, 2-chloro-4-(2-chloroethoxy)-6-(2,4,6-trimethylphenoxy)-1,3,5-triazine, 2-chloro-4-(2-bromoethoxy)-6-(2,4,6-trimethylphenoxy)-1,3,5-triazine, 2-chloro-4-(2-di-n-butylphosphateethoxy)-6-(2,4,6-trimethylphenoxy)-1,3,5-triazine and 2-chloro-4-(2-di-n-butylphosphateethoxy)-6-(2,6-xylenoxy)-1,3,5-triazine.

Such a compound is easily produced by reacting cyanur chloride (namely, 2,4,6-trichlorotriazine) with, for example, a hydroxy compound, thio compound or amino compound corresponding to the substituent on the heterocycle.

These hardeners are preferably used in an amount of 0.001 to 1 g, and further preferably 0.005 to 0.5 g, per 1 g of the hydrophilic binder.

<Emulsion>

An emulsion is preferably incorporated in the receptor layer of the heat-sensitive transfer image-receiving sheet for use in the present invention. The following is a detailed explanation of the emulsion that is preferably used in the present invention.

Hydrophobic additives, such as a lubricant, an antioxidant, and the like, can be introduced into a layer of the image-receiving sheet (e.g. the receptor layer, the heat insulation layer, the undercoat layer), by using a known method described in U.S. Pat. No. 2,322,027, or the like. In this case, a high-boiling organic solvent, as described in U.S Pat. Nos. 4,555,470, 4,536,466, 4,536,467, 4,587,206, 4,555,476 and 4,599,296, JP-B-3-62256, and the like, may be used singly or in combination with a low-boiling organic solvent having a boiling point of 50 to 160° C., according to the need. Also, these lubricants, antioxidants, and high-boiling organic solvents may be respectively used in combination of two or more.

As the antioxidant (hereinafter, also referred to as a radical trapper in this specification), a compound represented by any one of the following formulae (E-1) to (E-3) is preferably used.

Formula (E-1)

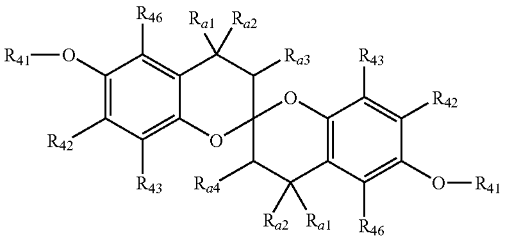

Formula (E-2)

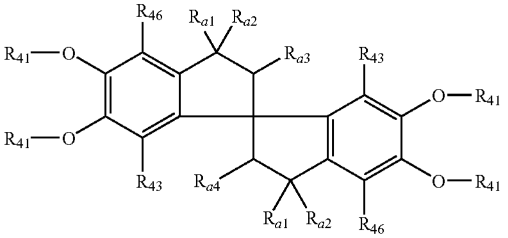

Formula (E-3)

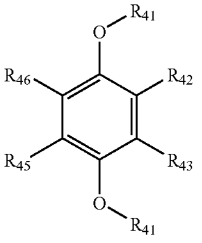

$R_{41}$ represents an aliphatic group, an aryl group, a heterocyclic group, an acyl group, an aliphatic oxycarbonyl group, an aryloxycarbonyl group, an aliphatic sulfonyl group, an arylsulfonyl group, a phosphoryl group, or a group —$Si(R_{47})(R_{48})(R_{49})$ in which $R_{47}$, $R_{48}$ and $R_{49}$ each independently represent an aliphatic group, an aryl group, an aliphatic oxy group, or an aryloxy group. $R_{42}$ to $R_{46}$ each independently represent a hydrogen atom, or a substituent. $R_{a1}$, $R_{a2}$, $R_{a3}$, and $R_{a4}$ each independently represent a hydrogen atom, or an aliphatic group (for example, methyl, ethyl).

With respect to the compounds represented by any one of the Formulae (E-1) to (E-3), the groups that are preferred from the viewpoint of the effect to be obtained by the present invention, are explained below.

In the Formulae (E-1) to (E-3), it is preferred that $R_{41}$ represent an aliphatic group, an acyl group, an aliphatic oxycarbonyl group, an aryloxycarbonyl group, or a phosphoryl group, and $R_{42}$, $R_{43}$, $R_{45}$, and $R_{46}$ each independently represent a hydrogen atom, an aliphatic group, an aliphatic oxy group, or an acylamino group. It is more preferred that $R_{41}$ represent an aliphatic group, and $R_{42}$, $R_{43}$, $R_{45}$ and $R_{46}$ each independently represent a hydrogen atom or an aliphatic group.

Preferable specific examples of the compounds represented by any one of the Formulae (E-1) to (E-3) are shown below, but the present invention is not limited to these compounds.

EB-1

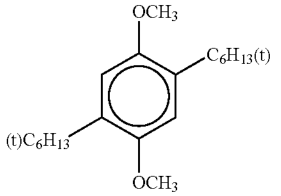

EB-2

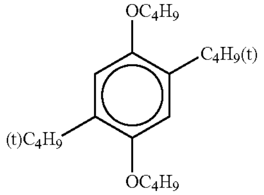

EB-3

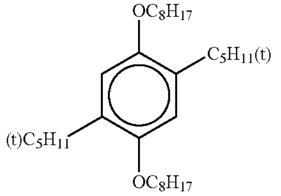

EB-4

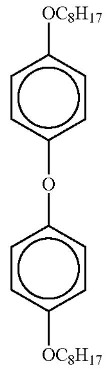

-continued

EB-5

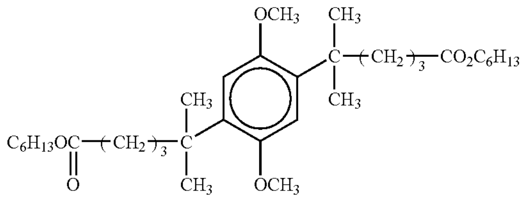

EB-6

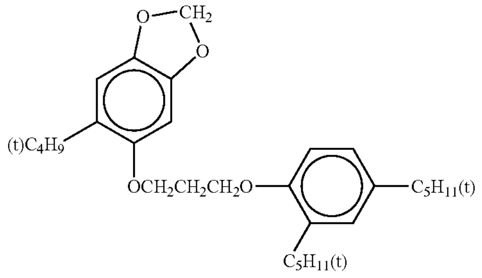

EB-7

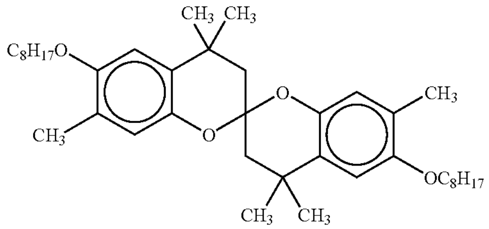

EB-8

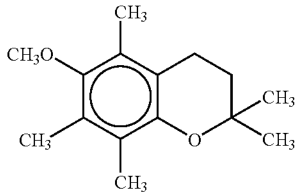

EB-9

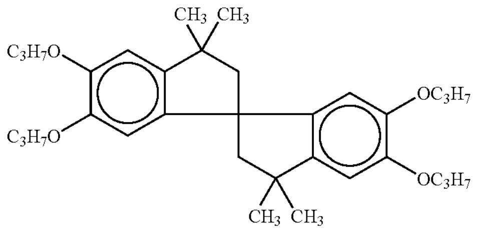

EB-10

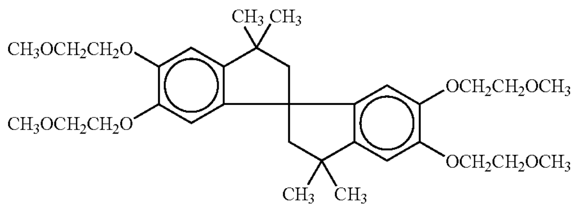

-continued

EB-11

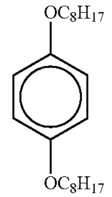

A content of the antioxidizing agent is preferably from 1.0 to 7.0 mass %, more preferably from 2.5 to 5.0 mass %, based on a solid content in the polymer latex.

As the lubricant, solid waxes such as polyethylene wax, amide wax and Teflon (registered trademark) powder; silicone oil, phosphate-series compounds, fluorine-based surfactants, silicone-based surfactants and others including releasing agents known in the technical fields concerned may be used. Fluorine-series compounds typified by fluorine-based surfactants, silicone-based surfactants and silicone-series compounds such as silicone oil and/or its hardened products are preferably used. A content of the lubricant is preferably from 1.0 to 10.0 mass %, more preferably from 1.5 to 2.5 mass %, based on a solid content in the polymer latex.

As the silicone oil as the lubricant, straight silicone oil and modified silicone oil or their hardened products may be used.

Examples of the straight silicone oil include dimethylsilicone oil, methylphenylsilicone oil and methyl hydrogen silicone oil. Examples ofthe dimethylsilicone oil include KF96-10, KF96-100, KF96-1000, KF96H-10000, KF96H-12500 and KF96H-100000 (all of these names are trade names, manufactured by Shin-Etsu Chemical Co., Ltd.). Examples of the methylphenylsilicone oil include KF50-100, KF54 and KF56 (all of these names are trade names, manufactured by Shin-Etsu Chemical Co., Ltd.).

The modified silicone oil may be classified into reactive silicone oils and non-reactive silicone oils.

Examples of the reactive silicone oils include amino-modified, epoxy-modified, carboxyl-modified, hydroxy-modified, methacryl-modified, mercapto-modified, phenol-modified or one-terminal reactive/hetero-functional group-modified silicone oils. Examples of the amino-modified silicone oil include KF-393, KF-857, KF-858, X-22-3680, X-22-3801C, KF-8010, X-22-161A and KF-8012 (all of these names are trade names, manufactured by Shin-Etsu Chemical Co., Ltd.). Examples of the epoxy-modified silicone oil include KF-100T, KF-101, KF-60-164, KF-103, X-22-343 and X-22-3000T (all of these names are trade names, manufactured by Shin-Etsu Chemical Co., Ltd.). Examples of the carboxyl-modified silicone oil include X-22-162C (trade name, manufactured by Shin-Etsu Chemical Co., Ltd.). Examples of the hydroxy-modified silicone oil include X-22-160AS, KF-6001, KF-6002, KF-6003, X-22-170DX, X-22-176DX, X-22-176D and X-22-176DF (all of these names are trade names, manufactured by Shin-Etsu Chemical Co., Ltd.). Examples of the methacryl-modified silicone oil include X-22-164A, X-22-164C, X-24-8201, X-22-174D and X-22-2426 (all of these names are trade names, manufactured by Shin-Etsu Chemical Co., Ltd.).

Reactive silicone oils may be hardened upon use, and may be classified into a reaction-curable type, photocurable type and catalyst-curable type. Among these types, silicone oil that is the reaction-curable type is particularly preferable. As the reaction-curable type silicone oil, products obtained by reacting an amino-modified silicone oil with an epoxy-modified silicone oil and then by curing are desirable. Also, examples of the catalyst-curable type or photocurable type silicone oil include KS-705F-PS, KS-705F-PS-1 and KS-770-PL-3 (all of these names are trade names, catalyst-curable silicone oils, manufactured by Shin-Etsu Chemical Co., Ltd.) and KS-720 and KS-774-PL-3 (all of these names are trade names, photocurable silicone oils, manufactured by Shin-Etsu Chemical Co., Ltd.). The addition amount of the curable type silicone oil is preferably 0.5 to 30% by mass based on the resin constituting the receptor layer. The releasing agent is used preferably in an amount of 2 to 4% by mass and further preferably 2 to 3% by mass based on 100 parts by mass of the polyester resin. If the amount is too small, the releasability cannot be secured without fail, whereas if the amount is excessive, a protective layer is not transferred to the image-receiving sheet resultantly.

Examples of the non-reactive silicone oil include polyether-modified, methylstyryl-modified, alkyl-modified, higher fatty acid ester-modified, hydrophilic special-modified, higher alkoxy-modified or fluorine-modified silicone oils. Examples of the polyether-modified silicone oil include KF-6012 (trade name, manufactured by Shin-Etsu Chemical Co., Ltd.) and examples of the methylstyryl-modified silicone oil include 24-510 and KF41-410 (all of these names are trade names, manufactured by Shin-Etsu Chemical Co., Ltd.). Modified silicones represented by any one of the following Formulae 11 to 13 may also be used.

Formula 11

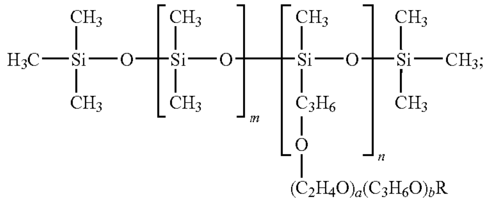

In the Formula 11, R represents a hydrogen atom or a straight-chain or branched alkyl group which may be substituted with an aryl or cycloalkyl group. m and n respectively denote an integer of 2,000 or less, and a and b respectively denote an integer of 30 or less.

Formula 12

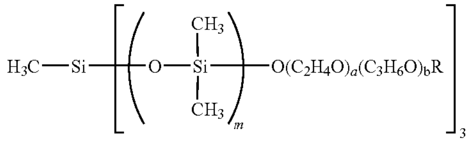

In the Formula 12, R represents a hydrogen atom, or a straight-chain or branched alkyl group which may be substituted with an aryl or cycloalkyl group. m denotes an integer of 2,000 or less, and a and b respectively denote an integer of 30 or less.

Formula 13

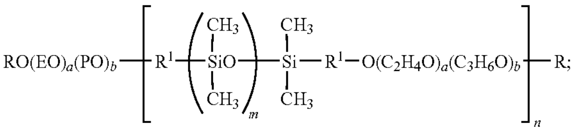

In the Formula 13, R represents a hydrogen atom, or a straight-chain or branched alkyl group which may be substituted with an aryl or cycloalkyl group. m and n respectively denote an integer of 2,000 or less, and a and b respectively denote an integer of 30 or less. $R^1$ represents a single bond or a divalent linking group, E represents an ethylene group which may be further substituted, and P represents a propylene group which may be further substituted.

Silicone oils such as those mentioned above are described in "SILICONE HANDBOOK" (The Nikkan Kogyo Shimbun, Ltd.) and the technologies described in JP-A-8-108636 and JP-A-2002-264543 may be preferably used as the technologies to cure the curable type silicone oils.

Examples of the high-boiling organic solvent include phthalates (e.g., dibutyl phthalate, dioctyl phthalate, di-2-ethylbexyl phthalate), phosphates or phosphonates (e.g., triphenyl phosphate, tricresyl phosphate, tri-2-ethylhexyl phosphate), fatty acid esters (e.g., di-2-ethylhexyl succinate, tributyl citrate), benzoates (e.g., 2-ethylhexyl benzoate, dodecyl benzoate), amides (e.g., N,N-diethyldodecane amide, N,N-dimethylolein amide), alcohols or phenols (e.g., isostearyl alcohol, 2,4-di-tert-amyl phenol), anilines (e.g., N,N-dibutyl-2-butoxy-5-tert-octylaniline), chlorinated paraffins, hydrocarbons (e.g., dodecyl benzene, diisopropyl naphthalene), and carboxylic acids (e.g., 2-(2,4-di-tert-amyl phenoxy)butyrate).

Preferably the compounds shown below are used.

(Solv-1)

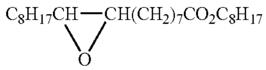

(Solv-2)

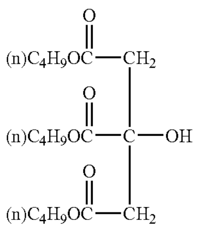

(Solv-3)

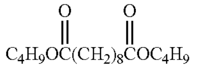

(Solv-4)

$O{=}P(OC_8H_{13}(n))_3$ (Solv-5)

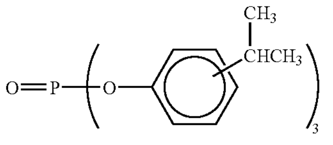

(Solv-6)

$C_8H_{17}CH{=}CHC_8H_{16}OH$

-continued (Solv-7)

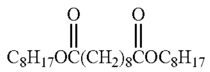

(Solv-8)

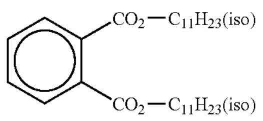

(Solv-9)

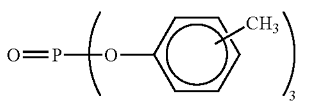

Further, the high-boiling organic solvent may be used in combination with, as an auxiliary solvent, an organic solvent having a boiling point of 30° C. or more and 160° C. or less, such as ethyl acetate, butyl acetate, methyl ethyl ketone, cyclohexanone, methylcellosolve acetate, or the like. The high-boiling organic solvent is used in an amount of generally 1 to 10 g, preferably 5 g or less, and more preferably 1 to 0.1 g, per 1 g of the hydrophobic additives to be used. The amount is also preferably 1 ml or less, more preferably 0.5 ml or less, and particularly preferably 0.3 ml or less, per 1 g of the binder.

A dispersion method that uses a polymer, as described in JP-B-51-39853 and JP-A-51-59943, and a method wherein the addition is made with them in the form of a dispersion of fine particles, as described in, for example, JP-A-62-30242, can also be used. In the case of a compound that is substantially insoluble in water, other than the above methods, a method can be used wherein the compound is dispersed and contained in the form of a fine particle in a binder.

When the hydrophobic compound is dispersed in a hydrophilic colloid, various surfactants may be used. For example, those listed as examples of the surfactant in JP-A-59-157636, page (37) to page (38) may be used. It is also possible to use phosphates-based surfactants described in JP-A-7-56267, JP-A-7-228589, and West German Patent Application Laid-Open (OLS) No. 1,932,299A.

<Ultraviolet Absorber>

Also, in the present invention, in order to improve light resistance, an ultraviolet absorber may be added to the receptor layer. In this case, when this ultraviolet absorber is made to have a higher molecular weight, it can be secured to the receptor layer so that it can be prevented, for instance, from being diffused into the ink sheet and from being sublimated and vaporized by heating.

As the ultraviolet absorber, compounds having various ultraviolet absorber skeletons, which are widely used in the field of information recording, may be used. Specific examples of the ultraviolet absorber may include compounds having a 2-hydroxybenzotriazole type ultraviolet absorber skeleton, 2-hydroxybenzotriazine type ultraviolet absorber skeleton, or 2-hydroxybenzophenon type ultraviolet absorber skeleton. Compounds having a benzotriazole-type or triazine-type skeleton are preferable from the viewpoint of ultraviolet absorbing ability (absorption coefficient) and stability, and compounds having a benzotriazole-type or benzophenone-type skeleton are preferable from the viewpoint of obtaining a higher-molecular weight and using in a form of a latex. Specifically, ultraviolet absorbers described in, for example, JP-A-2004-361936 may be used.

The ultraviolet absorber preferably absorbs light at wavelengths in the ultraviolet region, and the absorption edge of the absorption of the ultraviolet absorber is preferably out of the visible region. Specifically, when it is added to the receptor layer to form a heat-sensitive transfer image-receiving sheet, the heat-sensitive transfer image-receiving sheet has a reflection density of, preferably, Abs 0.5 or more at 370 nm, and more preferably Abs 0.5 or more at 380 nm. Also, the heat-sensitive transfer image-receiving sheet has a reflection density of, preferably, Abs 0.1 or less at 400 nm. If the reflection density at a wavelength range exceeding 400 nm is high, it is not preferable because an image is made yellowish.

In the present invention, the ultraviolet absorber is preferably made to have a higher molecular weight. The ultraviolet absorber has a mass average molecular weight of preferably 10,000 or more, and more preferably 100,000 or more. As a means of obtaining a higher-molecular weight ultraviolet absorber, it is preferable to graft an ultraviolet absorber on a polymer. The polymer as the principal chain preferably has a polymer skeleton less capable of being dyed than the receptor polymer to be used together. Also, when the polymer is used to form a film, the film preferably has sufficient film strength. The graft ratio of the ultraviolet absorber to the polymer principal chain is preferably 5 to 20% by mass and more preferably 8 to 15% by mass.

Also, it is more preferable that the ultraviolet-absorber-grafted polymer is made to be used in a form of a latex. When the polymer is made to be used in a form of a latex, an aqueous dispersion-system coating solution may be used in application and coating to form the receptor layer, and this enables reduction of production cost. As a method of making the latex polymer (or making the polymer latex-wise), a method described in, for example, Japanese Patent No. 3,450,339 may be used. As the ultraviolet absorber to be used in a form of a latex, the following commercially available ultraviolet absorbers may be used which include ULS-700, ULS-1700, ULS-1383MA, ULS-1635MH, XL-7016, ULS-933LP, and ULS-935LH, manufactured by Ipposha Oil Industries Co., Ltd.; and New Coat UVA-1025W, New Coat UVA-204W, and New Coat UVA-4512M, manufactured by Shin-Nakamura Chemical Co., Ltd. (all of these names are trade names).

In the case of using an ultraviolet-absorber-grafted polymer in a form of a latex, it may be mixed with a latex of the receptor polymer capable of being dyed, and the resulting mixture is coated. By doing so, a receptor layer, in which the ultraviolet absorber is homogeneously dispersed, can be formed.

The addition amount of the ultraviolet-absorber-grafted polymer or its latex is preferably 5 to 50 parts by mass, and more preferably 10 to 30 parts by mass, per 100 parts by mass of the receptor polymer latex capable of being dyed to be used to form the receptor layer.

<Releasing Agent>

Also, a releasing agent may be compounded in the receptor layer, in order to prevent thermal fusion with the heat-sensitive transfer sheet when an image is formed. As the releasing agent, a silicone oil, a phosphate-based plasticizer, or a fluorine-series compound may be used, and the silicone oil is particularly preferably used. As the silicone oil, modified silicone oil, such as epoxy-modified, alkyl-modified, amino-modified, carboxyl-modified, alcohol-modified, fluorine-modified, alkyl aralkyl polyether-modified, epoxy/polyether-modified, or polyether-modified silicone oil, is preferably used. Among these, a reaction product between vinyl-modified silicone oil and hydrogen-modified silicone oil is preferable. The amount of the releasing agent is preferably 0.2 to 30 parts by mass, to 100 parts by mass of the receptor polymer.

The amount of the receptor layer to be applied is preferably 0.5 to 10 g/$m^2$ (solid basis, hereinafter, the amount to be applied in the present specification means a value on solid basis unless otherwise noted). The film thickness of the receptor layer is preferably 1 to 20 μm.

(Heat Insulation Layer)

A heat insulation layer serves to protect the support from heat when a thermal head or the like is used to carry out a transfer operation under heating. Also, because the heat insulation layer has high cushion characteristics, a heat-sensitive transfer image-receiving sheet having high printing sensitivity can be obtained even in the case of using paper as a substrate (support). The heat insulation layer may be a single layer, or multi-layers. The heat insulation layer is arranged at a nearer location to the support than the receptor layer.

In the image-receiving sheet for use in the present invention, the heat insulation layer contains hollow polymer particles.

The hollow polymer particles in the present invention are polymer particles having independent pores inside of the particles. Examples of the hollow polymer particles include (1) non-foaming type hollow particles obtained in the following manner: water is contained inside of a capsule wall formed of a polystyrene, acryl resin, or styrene/acryl resin and, after a coating solution is applied and dried, the water in the particles is vaporized out of the particles, with the result that the inside of each particle forms a hollow; (2) foaming type microballoons obtained in the following manner: a low-boiling point liquid such as butane and pentane is encapsulated in a resin constituted of any one of polyvinylidene chloride, polyacrylonitrile, polyacrylic acid and polyacrylate, and their mixture or polymer, and after the resin coating material is applied, it is heated to expand the low-boiling point liquid inside of the particles whereby the inside of each particle is made to be hollow; and (3) microballoons obtained by foaming the above (2) under heating in advance, to make hollow polymer particles.

These hollow polymer particles preferably have a hollow ratio of about 20 to 70%, and may be used in combinations of two or more. Specific examples of the above (1) include Rohpake 1055 manufactured by Rohm and Haas Co.; Boncoat PP-1000 manufactured by Dainippon Ink and Chemicals, Incorporated; SX866(B) manufactured by JSR Corporation; and Nippol MH5055 manufactured by Nippon Zeon (all of these product names are trade names). Specific examples of the above (2) include F-30 and F-50 manufactured by Matsumoto Yushi-Seiyaku Co., Ltd. (all of these product names are trade names). Specific examples of the above (3) include F-30E manufactured by Matsumoto Yushi-Seiyaku Co., Ltd, and Expancel 461DE, 551DE and 551DE20 manufactured by Nippon Ferrite (all of these product names are trade names). The hollow polymer particles for use in the heat insulation layer may be a latex thereof.

A water-dispersible resin or water-soluble type resin is preferably contained, as a binder, in the heat insulation layer containing the hollow polymer particles. As the binder resin that can be used in the present invention, known resins such as an acryl resin, styrene/acryl copolymer, polystyrene resin, polyvinyl alcohol resin, vinyl acetate resin, ethylene/vinyl acetate copolymer, vinyl chloride/vinyl acetate copolymer, styrene/butadiene copolymer, polyvinylidene chloride resin, cellulose derivative, casein, starch, and gelatin may be used. Also, these resins may be used either singly or as mixtures.

The solid content of the hollow polymer particles in the heat insulation layer preferably falls in a range from 5 to 2,000 parts by mass when the solid content of the binder resin is 100 parts by mass. Also, the ratio by mass of the solid content of the hollow polymer particles in the coating solution is preferably 1 to 70% by mass and more preferably 10 to 40% by mass. If the ratio of the hollow polymer particles is excessively low, sufficient heat insulation cannot be obtained, whereas if the ratio of the hollow polymer particles is excessively large, the adhesion between the hollow polymer particles is reduced, posing problems, for example, powder fall or film separation.

The particle size of the hollow polymer particles is preferably 0.1 to 20 μm, more preferably 0.1 to 2 μm and particularly preferably 0.1 to 1 μm. Also, the glass transition temperature (Tg) of the hollow polymer particles is preferably 70° C. or more and more preferably 100° C. or more.

The heat insulation layer of the heat-sensitive transfer image-receiving sheet that is used in the present invention is preferably free of any resins having poor resistance to an organic solvent, except for the hollow polymer particles. Incorporation of the resin having poor resistance to an organic solvent (resin having a dye-dyeing affinity) in the heat insulation layer is not preferable in view of increase in loss of image definition after image transfer. It is assumed that the color-edge definition loss increases by the reason that owing to the presence of both the resin having a dye-dyeing affinity and the hollow polymer particles in the heat insulation layer, a transferred dye that has dyed the receptor layer migrates through the heat insulation layer adjacent thereto at the lapse of time.

Herein, the term "poor resistance to an organic solvent" means that a solubility in an organic solvent (e.g., methyl ethyl ketone, ethyl acetate, benzene, toluene, xylene) is 1 mass % or more, preferably 0.5 mass % or more. For example, the above-mentioned polymer latex is included in the category of the resin having "poor resistance to an organic solvent".

The heat insulation layer preferably contains the above-mentioned water-soluble polymer. Preferable compounds that can be used as the water-soluble polymer are the same as those as mentioned above for the receptor layer.

An amount of the water-soluble polymer to be added in the heat insulation layer is preferably from 1 to 75 mass %, more preferably from 1 to 50 mass % to the entire heat insulation layer.

The heat insulation layer preferably contains a gelatin. The amount of the gelatin in the coating solution for the heat insulation layer is preferably 0.5 to 14% by mass, and particularly preferably 1 to 6% by mass. Also, the coating amount of the above hollow polymer in the heat insulation layer is preferably 1 to 100 $g/m^2$, and more preferably 5 to 20 $g/m^2$.

The heat insulation layer preferably contains a crosslinking agent (compound capable of crosslinking a water-soluble polymer). The water-soluble polymer that is contained in the heat insulation layer is preferably cross-linked with the crosslinking agent. Preferable compounds as well as a preferable amount of the crosslinking agent to be used are the same as those as mentioned above for the receptor layer.

A preferred ratio of a cross-linked water-soluble polymer in the heat insulation layer varies depending on the kind of the crosslinking agent, but the water-soluble polymer in the heat insulation layer is crosslinked by preferably 0.1 to 20 mass %, more preferably 1 to 10 mass %, based on the entire water-soluble polymer.

A thickness of the heat insulation layer containing the hollow polymer particles is preferably from 5 to 50 μm, more preferably from 5 to 40 μm.

(Undercoat Layer)

An undercoat layer may be formed between the receptor layer and the heat insulation layer. As the undercoat layer, for example, a white background regulation layer, a charge regulation layer, an adhesive layer or a primer layer is formed. These layers may be formed in the same manner as those described in, for example, each specification of Japanese Patent Nos. 3,585,599 and 2,925,244.

(Support)

In the present invention, a waterproof support is preferably used as the support. The use of the waterproof support makes it possible to prevent the support from absorbing moisture, whereby a fluctuation in the performance of the receptor layer with time can be prevented. As the waterproof support, for example, coated paper or laminate paper may be used.

-Coated Paper-

The coated paper is paper obtained by coating a sheet such as base paper with various resins, rubber latexes, or high-molecular materials, on one side or both sides of the sheet, wherein the coating amount differs depending on its use. Examples of such coated paper include art paper, cast coated paper, and Yankee paper.

It is proper to use a thermoplastic resin as the resin to be applied to the surface(s) of the base paper. As such a thermoplastic resin, the following thermoplastic resins (A) to (H) may be exemplified.

(A) Polyolefin resins such as polyethylene resin and polypropylene resin; copolymer resins composed of an olefin such as ethylene or propylene and another vinyl monomer; and acrylic resin.

(B) Thermoplastic resins having an ester linkage: for example, polyester resins obtained by condensation of a dicarboxylic acid component (such a dicarboxylic acid component may be substituted with a sulfonic acid group, a carboxyl group, or the like) and an alcohol component (such an alcohol component may be substituted with a hydroxyl group, or the like); polyacrylate resins or polymethacrylate resins such as polymethylmethacrylate, polybutylmethacrylate, polymethylacrylate, polybutylacrylate, or the like; polycarbonate resins, polyvinyl acetate resins, styrene acrylate resins, styrene-methacrylate copolymer resins, vinyltoluene acrylate resins, or the like.

Concrete examples of them are those described in JP-A-59-101395, JP-A-63-7971, JP-A-63-7972, JP-A-63-7973, and JP-A-60-294862.

Commercially available thermoplastic resins usable herein are, for example, Vylon 290, Vylon 200, Vylon 280, Vylon 300, Vylon 103, Vylon GK-140, and Vylon GK-130 (products of Toyobo Co., Ltd.); Tafton NE-382, Tafton U-5, ATR-2009, and ATR-2010 (products of Kao Corporation); Elitel UE 3500, UE 3210, XA-8153, KZA-7049, and KZA-1449 (products of Unitika Ltd.); and Polyester TP-220 and R-188 (products of The Nippon Synthetic Chemical Industry Co., Ltd.); and thermoplastic resins in the Hyros series from Seiko Chemical Industries Co., Ltd., and the like (all of these names are trade names).

(C) Polyurethane resins, etc.

(D) Polyamide resins, urea resins, etc.

(E) Polysulfone resins, etc.

(F) Polyvinyl chloride resins, polyvinylidene chloride resins, vinyl chloride/vinyl acetate copolymer resins, vinyl chloride/vinyl propionate copolymer resins, etc.

(G) Polyol resins such as polyvinyl butyral; and cellulose resins such as ethyl cellulose resin and cellulose acetate resin, and (H) Polycaprolactone resins, styrene/maleic anhydride resins, polyacrylonitrile resins, polyether resins, epoxy resins, and phenolic resins.

The thermoplastic resins may be used either alone or in combination of two or more.

The thermoplastic resin may contain a whitener, a conductive agent, a filler, a pigment or dye including, for example, titanium oxide, ultramarine blue, and carbon black; or the like, if necessary.

-Laminated Paper-

The laminated paper is a paper which is formed by laminating various kinds of resin, rubber, polymer sheets or films on a sheet such as a base paper or the like. Specific examples of the materials useable for the lamination include polyolefins, polyvinyl chlorides, polyethylene terephthalates, polystyrenes, polymethacrylates, polycarbonates, polyimides, and triacetylcelluloses. These resins may be used alone, or in combination of two or more.

Generally, the polyolefins are prepared by using a low-density polyethylene. However, for improving the thermal resistance of the support, it is preferred to use a polypropylene, a blend of a polypropylene and a polyethylene, a high-density polyethylene, or a blend of a high-density polyethylene and a low-density polyethylene. From the viewpoint of cost and its suitableness for the laminate, it is preferred to use the blend of a high-density polyethylene and a low-density polyethylene.

The blend of a high-density polyethylene and a low-density polyethylene is preferably used in a blend ratio (a mass ratio) of 1/9 to 9/1, more preferably 2/8 to 8/2, and most preferably 3/7 to 7/3. When the thermoplastic resin layer is formed on the both surfaces of the support, the back side of the support is preferably formed using, for example, the high-density polyethylene or the blend of a high-density polyethylene and a low-density polyethylene. The molecular weight of the polyethylenes is not particularly limited. Preferably, both of the high-density polyethylene and the low-density polyethylene have a melt index of 1.0 to 40 g/10 minute and a high extrudability.

The sheet or film may be subjected to a treatment to impart white reflection thereto. As a method of such a treatment, for example, a method of incorporating a pigment such as titanium oxide into the sheet or film can be mentioned.

The thickness of the support is preferably from 25 μm to 300 μm, more preferably from 50 μm to 260 μm, and further preferably from 75 μm to 220 μm. The support can have any rigidity according to the purpose. When it is used as a support for electrophotographic image-receiving sheet of photographic image quality, the rigidity thereof is preferably near to that in a support for use in color silver halide photography.

(Curling Control Layer)

When the support is exposed as it is, there is the case where the heat-sensitive transfer image-receiving sheet is made to curl by moisture and/or temperature in the environment. It is therefore preferable to form a curling control layer on the backside of the support. The curling control layer not only prevents the image-receiving sheet from curling but also has a water-proof function. For the curling control layer, a polyethylene laminate, a polypropylene laminate or the like is used. Specifically, the curling control layer may be formed in a manner similar to those described in, for example, JP-A-61-110135 and JP-A-6-202295.

(Writing Layer and Charge Controlling Layer)

For the writing layer and the charge control layer, an inorganic oxide colloid, an ionic polymer, or the like may be used. As the antistatic agent, any antistatic agents including cationic antistatic agents such as a quaternary ammonium salt and polyamine derivative, anionic antistatic agents such as alkyl phosphate, and nonionic antistatic agents such as fatty acid ester may be used. Specifically, the writing layer and the charge control layer may be formed in a manner similar to those described in the specification of Japanese Patent No. 3585585.

In the present invention, the above-described resin having poor resistance to an organic solvent or the water-soluble polymer used in the image-receiving sheet is preferably in the form of an aqueous dispersion.

The method of producing the heat-sensitive transfer image-receiving sheet for use in the present invention is explained below.

The heat-sensitive transfer image-receiving sheet for use in the present invention may be prepared by coating each of layers using a usual method such as a roll coating, a bar coating, a gravure coating and a gravure reverse coating, followed by drying the layers.

Alternatively, the heat-sensitive transfer image-receiving sheet for use in the present invention may be also prepared by simultaneous double-layer coating the receptor layer and the heat insulation layer on the support.

It is known that in the case of producing an image-receiving sheet composed of plural layers having different functions from each other (for example, an air cell layer, heat insulation layer, intermediate layer and receptor layer) on a support, it may be produced by applying and overlapping each layer one by one or by applying materials prepared in advance by coating a support with each layer, as shown in, for example, JP-A-2004-106283, JP-A-2004-181888 and JP-A-2004-345267. It has been known in photographic industries, on the other hand, that productivity can be greatly improved by applying plural layers simultaneously as a multilayer. For example, there are known methods such as the so-called slide coating (slide coating method) and curtain coating (curtain coating method) as described in, for example, U.S. Pat. Nos. 2,761,791, 2,681,234, 3,508,947, 4,457,256 and 3,993,019; JP-A-63-54975, JP-A-61-278848, JP-A-55-86557, JP-A-52-31727, JP-A-55-142565, JP-A-50-43140, JP-A-63-80872, JP-A-54-54020, JP-A-5-104061, JP-A-5-127305, and JP-B-49-7050; and Edgar B. Gutoff, et al., "Coating and Drying Defects: Troubleshooting Operating Problems", John Wiley & Sons Company, 1995, pp. 101-103.

In the present invention, it has been found that the productivity is greatly improved and image defects can be remarkably reduced at the same time, by using the above simultaneous multilayer coating for the production of an image-receiving sheet having a multilayer structure.

The plural layers in the present invention are structured using resins as its major components. Coating solutions forming each layer are preferably water-dispersible latexes. The solid content by mass of the resin put in a latex state in each layer coating solution is preferably in a range from 5 to 80% and particularly preferably 20 to 60%. The average particle size of the resin contained in the above water-dispersed latex is preferably 5 μm or less and particularly preferably 1 μm or less. The above water dispersed latex may contain a known additive, such as a surfactant, a dispersant, and a binder resin, according to the need.

In the present invention, it is preferred that a laminate composed of plural layers be formed on a support and solidified just after the forming, according to the method described in U.S. Pat. No. 2,761,791. For example, in the case of solidifying a multilayer structure by using a resin, it is preferable to raise the temperature immediately after the plural layers are formed on the support. Also, in the case where a binder (e.g., a gelatin) to be gelled at lower temperatures is contained, there is the case where it is preferable to drop the temperature immediately after the plural layers are formed on the support.

In the present invention, the coating amount of a coating solution per one layer constituting the multilayer is preferably in a range from 1 $g/m^2$ to 500 $g/m^2$. The number of layers in the multilayer structure may be arbitrarily selected from a number of 2 or more. The receptor layer is preferably disposed as a layer most apart from the support.

In the image-forming method of the present invention, a thermal transfer image is formed by superposing the heat-sensitive transfer sheet described later on the above-mentioned heat-sensitive transfer image-receiving sheet so that the thermal transfer layer of the heat-sensitive transfer sheet and the receptor layer of the heat-sensitive transfer image-receiving sheet can be contacted with each other, and then providing thermal energy in accordance with image signals. As a means for providing heat energy in the thermal transfer, any of the conventionally known providing means may be used. For example, an image can be formed by giving thermal energy in accordance with image signals using an ordinary thermal head. In case of using the thermal head, for example, a heat energy of about 5 to 100 $mJ/mm^2$ is applied by controlling recording time with a recording device such as a thermal printer (e.g., Video printer VY-100 (trade name), manufactured by Hitachi, Ltd.), whereby the expected object can be attained sufficiently.

Also, the heat-sensitive transfer image-receiving sheet for use in the present invention may be used in various applications enabling thermal transfer recording, such as heat-sensitive transfer image-receiving sheets in a form of thin sheets (cut sheets) or rolls; cards; and transmittable type manuscript-making sheets, by optionally selecting the type of support.

2) Heat-Sensitive Transfer Sheet

Next, the heat-sensitive (thermal) transfer sheet (ink sheet) for use in the present invention is explained below.

The ink sheet that is used in combination with the above-mentioned heat-sensitive transfer image-receiving sheet at the time when a thermal transfer image is formed, is provided with, on a support, a thermal transfer layer containing a diffusion transfer dye (hereinafter, also referred to as "dye layer"). The dye layer is applied using a usual method such as a roll coating, a bar coating, a gravure coating, and a gravure reverse coating.

The thermal transfer layer (dye layer) of the ink sheet for use in the present invention contains at least one compound represented by formula (1), (2), (3), (4), (5), (6) or (7) described below. The thermal transfer layer preferably contains at least one compound represented by formula (1) or (2), at least one compound represented by formula (3), (4) or (5), and at least one compound represented by formula (6) or (7).

These compounds are explained below.

Formula (1)

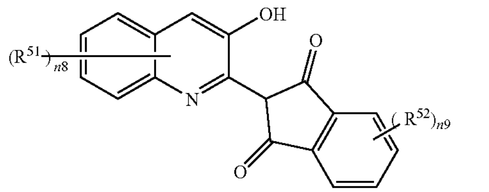

In formula (1), $R^{51}$ and $R^{52}$ each independently represents a substituent, n8 represents an integer of 0 to 5, and n9 represents an integer of 0 to 4. When n8 represents an integer of 2 to 5, $R^{51}$s may be the same or different from each other; and when n9 represents an integer of 2 to 4, $R^{52}$s may be the same or different from each other.

Examples of the substituents represented by $R^{51}$ and $R^{52}$ include a halogen atom, an alkyl group (including a cycloalkyl group regardless of ring number), an alkenyl group (including a cycloalkenyl group regardless of ring number), an alkynyl group, an aryl group, a heterocyclic group, a cyano group, an alkoxy group, an aryloxy group, an acyloxy group, a carbamoyloxy group, an alkoxycarbonyloxy group, an aryloxycarbonyloxy group, an amino group (including an alkylamino group and an anilino group), an acylamino group, an aminocarbonylamino group, an alkoxycarbonylamino group, an aryloxycarbonylamino group, a sulfamoylamino group, an alkyl- or aryl-sulfonylamino group, an alkylthio group, an sulfamoyl group, an alkyl- or aryl-sulfinyl group, an alkyl- or aryl-sulfonyl group, an acyl group, an aryloxycarbonyl group, an alkoxycarbonyl group, a carbamoyl group, an aryl- or heterocyclic-azo group, and an imido group. Each of the above-mentioned substituents may be further substituted.

Examples of the halogen atom represented by $R^{51}$ and $R^{52}$ include a fluorine atom, a chlorine atom, a bromine atom, and an iodine atom. Among these, a chlorine atom and a bromine atom are preferably, and a chlorine atom is particularly preferable.

The alkyl group represented by $R^{51}$ and $R^{52}$ includes a cycloalkyl group and a bicycloalkyl group. The alkyl group also includes straight or branched chain and substituted or unsubstituted alkyl groups. The straight or branched chain and substituted or unsubstituted alkyl groups are preferably ones having 1 to 30 carbon atoms. Examples thereof include methyl, ethyl, n-propyl, isopropyl, t-butyl, n-octyl, eicosyl, 2-chloroethyl, 2-cyanoethyl and 2-ethylhexyl. The cycloalkyl group includes substituted or unsubstituted cycloalkyl groups. The substituted or unsubstituted cycloalkyl groups are preferably ones having 3 to 30 carbon atoms. Examples thereof include cyclohexyl, cyclopentyl, and 4-n-dodecylcyclohexyl. The bicycloalkyl group is preferably a substituted or unsubstituted bicycloalkyl group having from 5 to 30 carbon atoms, namely, a monovalent group resultant from removing one hydrogen atom of a bicycloalkane having from 5 to 30 carbon atoms. Examples thereof include bicyclo[1,2,2]heptane-2-yl and bicyclo[2,2,2]octane-3-yl. The alkyl group also includes alkyl groups having a multi-ring structure such as a tricyclo structure. The above-mentioned concept of the alkyl group is also applied to an alkyl moiety of the substituents (e.g., an alkyl moiety of the alkylthio group) that are explained below.

The alkenyl group represented by $R^{51}$ and $R^{52}$ includes a cycloalkenyl group and a bicycloalkenyl group. The alkenyl group also includes straight or branched chain or cyclic, and substituted or unsubstituted alkenyl groups. The alkenyl group is preferably an alkenyl group having 2 to 30 carbon atoms. Examples thereof include vinyl, allyl, prenyl, geranyl and oleyl. The cycloalkenyl group is preferably a substituted or unsubstituted cycloalkenyl group having 3 to 30 carbon atoms, namely a monovalent group resultant from removing one hydrogen atom of a cycloalkene group having 3 to 30 carbon atoms. Examples thereof include 2-cyclopentene-1-yl and 2-cyclohexene-1-yl. The bicycloalkenyl group includes a substituted or unsubstituted bicycloalkenyl group. The bicycloalkenyl group is preferably a substituted or unsubstituted bicycloalkenyl group having 5 to 30 carbon atoms, namely a monovalent group resultant from removing one hydrogen atom from a bicycloalkene having one double bond. Examples thereof include bicyclo[2,2,1]hept-2-ene-1-yl and bicyclo[2,2,2]oct-2-ene-4-yl.

The alkynyl group represented by $R^{51}$ and $R^{52}$ is preferably a substituted or unsubstituted alkynyl group having 2 to 30 carbon atoms. Examples thereof include ethynyl and propargyl.

The aryl group represented by $R^{51}$ and $R^{52}$ is preferably a substituted or unsubstituted aryl group having 6 to 30 carbon atoms. Examples thereof include phenyl, p-tolyl, naphthyl, m-chlorophenyl and o-hexadecanoylaminophenyl.

The heterocyclic group represented by $R^{51}$ and $R^{52}$ is preferably a monovalent group resultant from removing one hydrogen atom from a substituted or unsubstituted and aromatic or non-aromatic 5- or 6-membered heterocyclic compound. The hetero ring in the heterocyclic group may be a condensed ring. The heterocyclic group is more preferably a 5- or 6-membered aromatic heterocyclic group having 3 to 30 carbon atoms. In place of the heterocyclic group, hetero rings are exemplified below without denotation of their substitution sites: pyridine, pyrazine, pyridazine, pyrimidine, triazine, quinoline, isoquinoline, quinazoline, cinnoline, phthalazine, quinoxaline, pyrrol, indole, fuiran, benzofuiran, thiophene, benzothiophene, pyrrazole, imidazole, benzimidazole, triazole, oxazole, benzoxazole, thiazole, benzothiazole, isothiazole, benzisothiazole, thiadiazole, isoxazole, benzoisoxazole, pyrrolidine, piperidine, piperazine, imidazolidine and thiazoline.

The alkoxy group represented by $R^{51}$ and $R^{52}$ includes a substituted or unsubstituted alkoxy group. The substituted or unsubstituted alkoxy group is preferably an alkoxy group having 1 to 30 carbon atoms. Examples of the alkoxy group include methoxy, ethoxy, isopropoxy, n-octyloxy, methoxyethoxy, hydroxyethoxy and 3-carboxypropoxy.

The aryloxy group represented by $R^{51}$ and $R^{52}$ is preferably a substituted or unsubstituted aryloxy group having 6 to 30 carbon atoms. Examples of the aryloxy group include phenoxy, 2-methylphenoxy, 4-t-butylphenoxy, 3-nitrophenoxy and 2-tetradecanoylaminophenoxy.

The acyloxy group represented by $R^{51}$ and $R^{52}$ is preferably a formyloxy group, a substituted or unsubstituted alkylcarbonyloxy group having 2 to 30 carbon atoms, and a substituted or unsubstituted arylcarbonyloxy group having 6 to 30 carbon atoms. Examples of the acyloxy group include formyloxy, acetyloxy, pivaloyloxy, stearoyloxy, benzoyloxy and p-methoxyphenyl carbonyloxy.

The carbamoyloxy group represented by $R^{51}$ and $R^{52}$ is preferably a substituted or unsubstituted carbamoyloxy group having 1 to 30 carbon atoms. Examples of the carbamoyloxy group include N,N-dimethylcarbamoyloxy, N,N-diethylcarbamoyloxy, morpholino carbamoyloxy, N,N-di-n-octylaminocarbonyloxy and N-n-octylcarbamoyloxy.

The alkoxycarbonyloxy group represented by $R^{51}$ and $R^{52}$ is preferably a substituted or unsubstituted alkoxycarbonyloxy group having 2 to 30 carbon atoms. Examples of the alkoxycarbonyloxy group include methoxycarbonyloxy, ethoxycarbonyloxy, t-butoxycarbonyloxy and n-octylcarbonyloxy.

The aryloxycarbonyloxy group represented by $R^{51}$ and $R^{52}$ is preferably a substituted or unsubstituted aryloxycarbonyloxy group having 7 to 30 carbon atoms. Examples of the aryloxycarbonyloxy group include phenoxycarbonyloxy, p-methoxyphenoxycarbonyloxy and p-n-hexadecyloxyphenoxycarbonyloxy.

The amino group represented by $R^{51}$ and $R^{52}$ includes an alkylamino group and an arylamino group. The amino group is preferably a substituted or unsubstituted alkylamino group having 1 to 30 carbon atoms or a substituted or unsubstituted arylamino group having 6 to 30 carbon atoms. Examples of the amino group include amino, methylamino, dimethylamino, anilino, N-methyl-anilino, diphenylamino, hydroxyethylamino, carboxyethylamino, sulfoethylamino and 3,5-dicarboxyanilino.

The acylamino group represented by $R^{51}$ and $R^{52}$ is preferably a formylamino group, a substituted or unsubstituted alkylcarbonylamino group having 1 to 30 carbon atoms or a substituted or unsubstituted arylcarbonylamino group having 6 to 30 carbon atoms. Examples of the acylamino group include formylamino, acetylamino, pivaloylamino, lauroylamino, benzoylamino and 3,4,5-tri-n-octyloxyphenylcarbonylamino.

The aminocarbonylamino group represented by $R^{51}$ and $R^{52}$ is preferably a substituted or unsubstituted aminocarbonylamino group having 1 to 30 carbon atoms. Examples of the aminocarbonylamino group include carbamoylamino, N,N-dimethylaminocarbonylamino, N,N-diethylaminocarbonylamino and morpholinocarbonylamino.

The alkoxycaronylamino group represented by $R^{51}$ and $R^{52}$ is preferably a substituted or unsubstituted alkoxycarbonylamino group having 2 to 30 carbon atoms. Examples of the alkoxycaronylamino group include methoxycarbonylamino, ethoxycarbonylamino, t-butoxycarbonylamino, n-octadecyloxycarbonylamino and N-methyl-methoxycarbonylamino.

The aryloxycarbonylamino group represented by $R^{51}$ and $R^{52}$ is preferably a substituted or unsubstituted aryloxycarbonylamino group having 7 to 30 carbon atoms. Examples of the aryloxycarbonylamino group include phenoxycarbonylamino, p-chlorophenoxycarbonylamino and m-n-octyloxyphenoxycarbonylamino.

The sulfamoylamino group represented by $R^{51}$ and $R^{52}$ is preferably a substituted or unsubstituted sulfamoylamino group having 0 to 30 carbon atoms. Examples of the sulfamoylamino group include sulfamoylamino, N,N-dimethylaminosulfonylamino and N-n-octylaminosulfonylamino.

The alkyl- or aryl-sulfonylamino group represented by $R^{51}$ and $R^{52}$ is preferably a substituted or unsubstituted alkylsulfonylamino group having 1 to 30 carbon atoms or a substituted or unsubstituted arylsulfonylamino group having 6 to 30 carbon atoms. Examples of the alkylsulfonylamino group and the arylsulfonylamino group include methylsulfonylamino, butylsulfonylamino, phenylsulfonylamino, 2,3,5-trichlorophenylsulfonylamino and p-methylphenylsulfonylamino.

The alkylthio group represented by $R^{51}$ and $R^{52}$ is preferably a substituted or unsubstituted alkylthio group having 1 to 30 carbon atoms. Examples of the alkylthio group include methylthio, ethylthio and n-hexadecylthio.

The sulfamoyl group represented by $R^{51}$ and $R^{52}$ is preferably a substituted or unsubstituted sulfamoyl group having 0 to 30 carbon atoms. Examples of the sulfamoyl group include N-ethylsulfamoyl, N-(3-dodecyloxypropyl)sulfamoyl, N,N-dimethylsulfamoyl, N-acetylsulfamoyl, N-benzoylsulfamoyl and N-(N'-phenylcarbamoyl)sulfamoyl.

The alkyl- or aryl-sulfinyl group represented by $R^{51}$ and $R^{52}$ is preferably a substituted or unsubstituted alkylsulfinyl group having 1 to 30 carbon atoms or a substituted or unsubstituted arylsulfinyl group having 6 to 30 carbon atoms. Examples of the alkylsulfinyl group and the arylsulfinyl group include methylsulfinyl, ethylsulfinyl, phenylsulfinyl and p-methylphenylsulfinyl.

The alkyl- or aryl-sulfonyl group represented by $R^{51}$ and $R^{52}$ is preferably a substituted or unsubstituted alkylsulfonyl group having 1 to 30 carbon atoms or a substituted or unsubstituted arylsulfonyl group having 6 to 30 carbon atoms.

Examples of the alkylsulfonyl group and the arylsulfonyl group include methylsulfonyl, ethylsulfonyl, phenylsulfonyl and p-toluenesulfonyl.

The acyl group represented by $R^{51}$ and $R^{52}$ is preferably a formyl group, a substituted or unsubstituted alkylcarbonyl group having 2 to 30 carbon atoms, a substituted or unsubstituted arylcarbonyl group having 7 to 30 carbon atoms, or a substituted or unsubstituted heterocyclic carbonyl group having 4 to 30 carbon atoms in which one of the carbon atoms in the hetero ring bonds to the carbonyl moiety. Examples of the acyl group include acetyl, pivaloyl, 2-chloroacetyl, stearoyl, benzoyl, p-n-octyloxyphenylcarbonyl, 2-pyridylcarbonyl and 2-furylcarbonyl.

The aryloxycarbonyl group represented by $R^{51}$ and $R^{52}$ is preferably a substituted or unsubstituted aryloxycarbonyl group having 7 to 30 carbon atoms. Examples of the aryloxycarbonyl group include phenoxycarbonyl, o-chlorophenoxycarbonyl, m-nitrophenoxycarbonyl and p-t-butylphenoxycarbonyl.

The alkoxycarbonyl group represented by $R^{51}$ and $R^{52}$ is preferably a substituted or unsubstituted alkoxycarbonyl group having 2 to 30 carbon atoms. Examples of the alkoxycarbonyl group include methoxycarbonyl, ethoxycarbonyl, t-butoxycarbonyl and n-octadecyloxycarbonyl.

The carbamoyl group represented by $R^{51}$ and $R^{52}$ is preferably a substituted or unsubstituted carbamoyl group having 1 to 30 carbon atoms. Examples of the carbamoyl group include carbamoyl, N-methylcarbamoyl, N,N-dimethylcarbamoyl, N,N-di-n-octylcarbamoyl and N-(methylsulfonyl)carbamoyl.

Examples of the aryl- or heterocyclic-azo group represented by $R^{51}$ and $R^{52}$ include phenylazo, 4-methoxyphenylazo, 4-pivaloylaminophenylazo and 2-hydroxy-4-propanoylphenylazo.

Examples of the imido group represented by $R^{51}$ and $R^{52}$ include N-succinimido and N-phthalimido.

$R^{51}$ is preferably a halogen atom, an alkyl group, an alkenyl group, an alkynyl group, an aryl group, a heterocyclic group, a cyano group, an alkoxy group, an aryloxy group, an acyloxy group, a carbamoyloxy group, an alkoxycarbonyloxy group, an aryloxycarbonyloxy group, an amino group, an acylamino group, an aminocarbonylamino group, an alkoxycarbonylamino group, an aryloxycarbonylamino group, a sulfamoylamino group, an alkyl- or aryl-sufonylamino group, an alkylthio group, an sulfamoyl group, an alkyl- or aryl-sufinyl group, an alkyl- or aryl-sufonyl group, an acyl group, an aryloxycarbonyl group, an alkoxycarbonyl group or a carbamoyl group; more preferably a halogen atom, an alkyl group, an alkenyl group, an aryl group, a heterocyclic group, an alkoxy group, an aryloxy group, an acyloxy group, a carbamoyloxy group, an alkoxycarbonyloxy group, an aryloxycarbonyloxy group, an amino group, an acylamino group, an aminocarbonylamino group, an alkoxycarbonylamino group, an aryloxycarbonylamino group, an alkylthio group, an acyl group, an aryloxycarbonyl group, an alkoxycarbonyl group or a carbamoyl group; further preferably a halogen atom, a substituted or unsubstituted alkyl group, a substituted or unsubstituted alkenyl group, a substituted or unsubstituted aryl group or a substituted or unsubstituted heterocyclic group; furthermore preferably a substituted or unsubstituted alkyl group; and still furthermore preferably an alkyl group having 1 to 6 carbon atoms.

Examples of $R^{52}$ include those given as examples of the substituent represented by $R^{51}$, and preferable examples thereof are also the same as those of $R^{51}$. $R^{52}$ is more preferably an aryloxycarbonyl group having 6 to 10 carbon atoms, an alkoxycarbonyl group having 1 to 6 carbon atoms or a substituted or unsubstituted carbamoyl group; and furthermore preferably a substituted carbamoyl group.

n8 is an integer of 0 to 5, preferably an integer of 0 to 3; more preferably an integer of 0 to 2; and further preferably an integer of 0 or 1.

n9 is an integer of 0 to 4, preferably an integer of 0 to 3; and more preferably an integer of 0 to 2.

The following is an explanation about a preferable combination of various substituents that a dye represented by formula (1) may have: A preferred compound is a compound in which at least one of the substituents is the above-described preferable substituent. A more preferred compound is a compound in which many various substituents are the above-described preferable substituents. The most preferred compound is a compound in which all substituents are the above-described preferable substituents.

In the compound represented by formula (1), it is preferable that $R^{51}$ is an alkyl group having 1 to 6 carbon atoms; $R^{52}$ is a substituted or unsubstituted carbamoyl group, an aryloxycarbonyl group having 6 to 10 carbon atoms or an alkoxycarbonyl group having 1 to 6 carbon atoms; n8 is an integer of 0 to 3; and n9 is an integer of 0 to 3. It is more preferable that $R^{51}$ is an alkyl group having 1 to 6 carbon atoms; $R^{52}$ is a substituted or unsubstituted carbamoyl group, an aryloxycarbonyl group having 6 to 10 carbon atoms or an alkoxycarbonyl group having 1 to 6 carbon atoms; n8 is an integer of 0 to 2; and n9 is an integer of 0 to 2. It is further preferable that $R^{51}$ is an alkyl group having 1 to 6 carbon atoms, $R^{52}$ is a substituted or unsubstituted carbamoyl group, an aryloxycarbonyl group having 6 to 10 carbon atoms or an alkoxycarbonyl group having 1 to 6 carbon atoms; n8 is an integer of 0 or 1; and n9 is an integer of 0 to 2.

Next, the compound (dye) represented by formula (2) is explained in detail.

Formula (2)

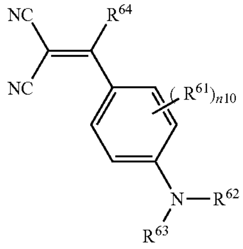

In formula (2), $R^{61}$ represents a substituent, and $R^{62}$, $R^{63}$ and $R^{64}$ each independently represents a hydrogen atom or a substituent. Examples of the substituents each represented by $R^{61}$ to $R^{64}$ include those given as examples of the substituents of the above-described $R^{51}$ and $R^{52}$. n10 represents an integer of 0 to 4. When n10 represents an integer of 2 to 4, $R^{61}$s may be the same or different from each other.

Examples of $R^{61}$ include those given as examples of the substituent as described about $R^{51}$, and preferable examples thereof are also same. $R^{61}$ is more preferably an alkyl group having 1 to 6 carbon atoms.

$R^{62}$ and $R^{63}$ each are preferably a hydrogen atom, a substituted or unsubstituted alkyl group, a substituted or unsubstituted alkenyl group, a substituted or unsubstituted aryl group, or a substituted or unsubstituted heterocyclic group; more preferably a hydrogen atom or a substituted or unsubstituted alkyl group having 1 to 6 carbon atoms, and further preferably a substituted or unsubstituted alkyl group having 1 to 6 carbon atoms.

$R^{64}$ is preferably a hydrogen atom, a substituted or unsubstituted alkyl group, a substituted or unsubstituted alkenyl group, a substituted or unsubstituted aryl group, a substituted or unsubstituted heterocyclic group, a substituted or unsubstituted acylamino group, a substituted or unsubstituted aminocarbonylamino group, a substituted or unsubstituted alkoxycarbonylamino group, or a substituted or unsubstituted amino group; more preferably a hydrogen atom or a substituted or unsubstituted alkyl group; further preferably a hydrogen atom or a substituted or unsubstituted alkyl group having 1 to 6 carbon atoms; and still furthermore preferably a hydrogen atom.

n10 is an integer of 0 to 4, and preferably an integer of 0 or 1.

The following is an explanation about a preferable combination of various substituents (atoms) that a dye represented by formula (2) may have: A preferred compound is a compound in which at least one of the substituents is the above-described preferable substituent. A more preferred compound is a compound in which many various substituents are the above-described preferable substituents. The most preferred compound is a compound in which all substituents are the above-described preferable substituents.

In the compound represented by formula (2), it is preferable that $R^{61}$ is a substituted or unsubstituted alkyl group having 1 to 6 carbon atoms, $R^{62}$ is a substituted or unsubstituted alkyl group having 1 to 6 carbon atoms, $R^{63}$ is a substituted or unsubstituted alkyl group having 1 to 6 carbon atoms, $R^{64}$ is a hydrogen atom, and n10 is an integer of 0 to 4. It is more preferable that $R^{61}$ is a substituted or unsubstituted alkyl group having 1 to 6 carbon atoms, $R^{62}$ is a substituted or unsubstituted alkyl group having 1 to 6 carbon atoms, $R^{63}$ is a substituted or unsubstituted alkyl group having 1 to 6 carbon atoms, $R^{64}$ is a hydrogen atom, and n10 is 0 or 1.

Next, the compounds (dyes) represented by formula (3) and (4) are explained in detail.

Formula (3)

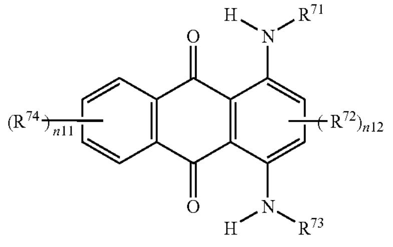

In formula (3), $R^{71}$ and $R^{73}$ each independently represents a hydrogen atom or a substituent, $R^{72}$ and $R^{74}$ each independently represents a substituent, n11 represents an integer of 0 to 4, and n12 represents an integer of 0 to 2. When n11 represents an integer of 2 to 4, $R^{74}$s may be the same or different from each other. When n12 represents 2, $R^{72}$s may be the same or different from each other. Examples of the substituents each represented by $R^{71}$ to $R^{74}$ include those given as examples of the substituent each represented by $R^{51}$ and $R^{52}$ set forth above.

Examples of the substituent represented by $R^{71}$ and $R^{73}$ include those given as examples of the substituents as described about $R^{62}$ and $R^{63}$, and preferable examples thereof are also same. $R^{71}$ and $R^{73}$ each are more preferably a hydrogen atom or a substituted or unsubstituted alkyl group having 1 to 6 carbon atoms, and further preferably a hydrogen atom.

Examples of the substituent represented by $R^{72}$ and $R^{74}$ include those given as examples of the substituent as described about $R^{51}$. $R^{72}$ and $R^{74}$ each independently are more preferably an alkoxy group, an aryloxy group, an acyloxy group, a carbamoyloxy group, an alkoxycarbonyloxy group or an aryloxycarbonyloxy group; and further preferably an alkoxy group and an aryloxy group. $R^{72}$ is further more preferably an aryloxy group. Each of these groups may be further substituted.

n11 is an integer of 0 to 4, and preferably an integer of 0.

n12 is an integer of 0 to 2, and preferably an integer of 2.

Formula (4)

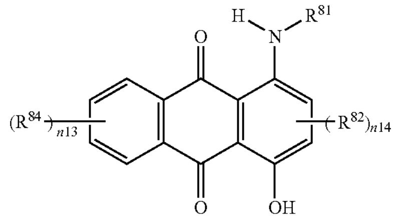

In formula (4), $R^{81}$ represents a hydrogen atom or a substituent, $R^{82}$ and $R^{84}$ each independently represents a substituent, n13 represents an integer of 0 to 4, and n14 represents an integer of 0 to 2. When n13 represents an integer of 2 to 4, $R^{84}$s may be the same or different from each other. When n14 represents 2, $R^{82}$s may be the same or different from each other. Examples of the substituents each represented by $R^{81}$, $R^{82}$ and $R^{84}$ include those given as examples of the substituent each represented by $R^{51}$ and $R^{52}$ set forth above.

Examples of the substituent represented by $R^{81}$ include those given as examples of the substituents as described about $R^{62}$ and $R^{63}$, and preferable examples thereof are also same. $R^{81}$ is more preferably a hydrogen atom or a substituted or unsubstituted alkyl group having 1 to 6 carbon atoms, and further preferably a hydrogen atom.

Examples of the substituent represented by $R^{82}$ and $R^{84}$ include those given as examples of the substituent as described about $R^{51}$. $R^{82}$ and $R^{84}$ each independently are more preferably an alkoxy group, an aryloxy group, an acyloxy group, a carbamoyloxy group, an alkoxycarbonyloxy group and an aryloxycarbonyloxy group; and further preferably an alkoxy group and an aryloxy group. $R^{82}$ is furthermore preferably an aryloxy group. Each of these groups may be further substituted.

n13 is an integer of 0 to 4, preferably an integer of an integer of 0 or 1, and more preferably 0.

n14 is an integer of 0 to 2, preferably an integer an integer of 0 or 1, and more preferably an integer of 1.

The following is an explanation about a preferable combination of various substituents (atoms) that a dye represented by formula (3) or (4) may have: A preferred compound is a compound in which at least one of the substituents is the above-described preferable substituent. A more preferred compound is a compound in which many various substituents are the above-described preferable substituents. The most preferred compound is a compound in which all substituents are the above-described preferable substituents.

In the compound represented by formula (3), it is preferable that $R^{71}$ is a hydrogen atom, $R^{72}$ is an aryloxy group, $R^{73}$ is a hydrogen atom, n11 is an integer of 0, and n12 is an integer of 0 to 2. It is more preferable that $R^{71}$ is a hydrogen atom, $R^{72}$ is an aryloxy group, $R^{73}$ is a hydrogen atom, n11 is integer of 0, and n12 is an integer of 2.

In the compound represented by formula (4), it is preferable that $R^{81}$ is a hydrogen atom, $R^{82}$ is an aryloxy group, n13 is an integer of 0, and n14 is an integer of 1 or 2. It is more preferable that $R^{81}$ is a hydrogen atom, $R^{82}$ is an aryloxy group, n13 is an integer of 0, and n14 is an integer of 1. It is further preferable that $R^{81}$ is a hydrogen atom, $R^{82}$ is an aryloxy group, n13 is an integer of 0, n14 is an integer of 1, and said $R^{82}$ is positioned at ortho-site to the amino group.

Next, the dye represented by formula (5) is explained in detail.

Formula (5)

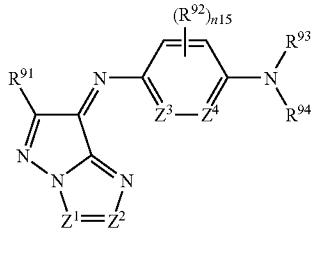

In formula (5), $R^{91}$ represents a hydrogen atom or a substituent, $R^{92}$ represents a substituent, $R^{93}$ and $R^{94}$ each independently represents a hydrogen atom or a substituent, and n15 represents an integer of 0 to 2. When n15 represents 2, $R^{92}$s may be the same or different from each other. One of $Z^1$ and $Z^2$ represents =N— and the other represents =C($R^{95}$)—. $Z^3$ and $Z^4$ each independently represents =N— or =C($R^{96}$)—. $R^{95}$ and $R^{96}$ each independently represents a hydrogen atom or a substituent. Examples of the substituents each represented by $R^{91}$ to $R^{96}$ include those given as examples of the substituent each represented by $R^{51}$ and $R^{52}$ set forth above.

$R^{91}$ is preferably a hydrogen atom, a substituted or unsubstituted alkyl group, a substituted or unsubstituted alkenyl group, a substituted or unsubstituted aryl group, a substituted or unsubstituted heterocyclic group or a substituted or unsubstituted amino group; more preferably a substituted or unsubstituted alkyl group having 1 to 6 carbon atoms or a substituted or unsubstituted aryl group having 6 to 10 carbon atoms; and further preferably a substituted or unsubstituted alkyl group.

Examples of $R^{92}$ include those given as examples of the substituent as described about $R^{51}$, and preferable examples thereof are also same. $R^{92}$ is more preferably a substituted or unsubstituted alkyl group having 1 to 6 carbon atoms.

Examples of the substituent represented by $R^{93}$ and $R^{94}$ include those given as examples of the substituents as described about $R^{62}$ and $R^{63}$, and preferable examples thereof are also same. $R^{93}$ and $R^{94}$ each are preferably a hydrogen atom and a substituted or unsubstituted alkyl group having 1 to 6 carbon atoms, and further preferably a substituted or unsubstituted alkyl group having 1 to 6 carbon atoms.

One of $Z^1$ and $Z^2$ represent =N— and the other represents =C($R^{95}$)—, in which $R^{95}$ represent a hydrogen atom or a substituent. It is preferable that $Z^1$ represent =C($R^{95}$)— and $Z^2$ represents =N—.

$Z^3$ and $Z^4$ each independently represent =N— or =C($R^{96}$)—, in which $R^{96}$ represents a hydrogen atom or a substituent. It is preferable that $Z^3$ represents =C($R^{96}$)— and $Z^4$ represents =N—.

Examples of the substituent according to $R^{95}$ and $R^{96}$ include those given as examples of the substituent as described about $R^{51}$, and preferable examples thereof are also same. $R^{95}$ is more preferably a hydrogen atom or a substituted or unsubstituted alkyl group. $R^{96}$ is more preferably a hydrogen atom, a substituted or unsubstituted alkyl group, or a substituted or unsubstituted aryl group.

n15 is an integer of 0 to 2, and preferably an integer of 0.

The following is an explanation about a preferable combination of various substituents (atoms) that a dye represented by formula (5) may have: A preferred compound is a compound in which at least one of the substituents is the above-described preferable substituent. A more preferred compound is a compound in which many various substituents are the above-described preferable substituents. The most preferred compound is a compound in which all substituents are the above-described preferable substituents.

In the compound represented by formula (5), it is preferable that one of $Z^1$ and $Z^2$ is =C($R^{95}$)— and the other is =N—, $Z^3$ is =C($R^{96}$)—, $Z^4$ is =N—, $R^{91}$ is a substituted or unsubstituted alkyl group, $R^{92}$ is a substituted or unsubstituted alkyl group, $R^{93}$ is a substituted or unsubstituted alkyl group, $R^{94}$ is a substituted or unsubstituted alkyl group, $R^{95}$ is a hydrogen atom, a substituted or unsubstituted alkyl group or a substituted or unsubstituted aryl group, and $R^{96}$ is a hydrogen atom, a substituted or unsubstituted alkyl group or a substituted or unsubstituted aryl group. It is more preferable that $Z^1$ is =C($R^{95}$)—, $Z^2$ is =N—, $Z^3$ is =C($R^{96}$)—, $Z^4$ is =N—, $R^{91}$ is a substituted or unsubstituted alkyl group, $R^{92}$ is a substituted or unsubstituted alkyl group, $R^{93}$ is a substituted or unsubstituted alkyl group, $R^{94}$ is a substituted or unsubstituted alkyl group, $R^{95}$ is a hydrogen atom, a substituted or unsubstituted alkyl group or a substituted or unsubstituted aryl group, and $R^{96}$ is a hydrogen atom, a substituted or unsubstituted alkyl group or a substituted or unsubstituted aryl group. In the above combinations, it is also preferable that n15 is an integer of 0.

Next, the dyes represented by formula (6) and (7) are explained in detail.

Formula (6)

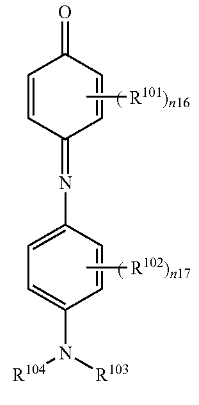

In formula (6), $R^{101}$ and $R^{102}$ each independently represents a substituent, $R^{103}$ and $R^{104}$ each independently represents a hydrogen atom or a substituent. Examples of the substituents each represented by $R^{101}$ to $R^{104}$ include those given as examples of the substituents each represented by $R^{51}$ and $R^{52}$ set forth above. n16 and n17 each independently represents an integer of 0 to 4. When n16 represents an integer of 2 to 4, $R^{101}$ may be the same or different from each other. When n17 represents an integer of 2 to 4, $R^{102}$s may be the same or different from each other.

Examples of $R^{101}$ include those given as examples of the substituent as described about $R^{51}$, and preferable examples thereof are also same. $R^{101}$ is more preferably an amino group (including an alkylamino group and an anilino group), an acylamino group, an aminocarbonylamino group, an alkoxycarbonylamino group, an aryloxycarbonylamino group, a sulfamoylamino group, an alkyl- or aryl-sulfonylamino group, a substituted or unsubstituted alkyl group or a halogen atom; further preferably a chlorine atom, a substituted or unsubstituted alkyl group having 1 to 6 carbon atoms, or an acylamino group; furthermore preferably an acylamino group; and furthermore preferably an acylamino group positioned at ortho-position to the O= group.

Examples of $R^{102}$ include those given as examples of the substituent as described about $R^{51}$, and preferable examples thereof are also same. $R^{102}$ is more preferably a substituted or unsubstituted alkyl group or a substituted or unsubstituted alkoxy group.

Examples of the substituents of $R^{103}$ and $R^{104}$ include those given as examples of the substituents as described about $R^{62}$ and $R^{63}$, and preferable examples thereof are also same. $R^{103}$ and $R^{104}$ each are more preferably a substituted or unsubstituted alkyl group or a substituted or unsubstituted aryl group, and furthermore preferably a substituted or unsubstituted alkyl group.

n16 is an integer of 0 to 4, and preferably an integer of 1 to 3.

n17 is an integer of 0 to 4, preferably an integer of 0 to 2, and more preferably an integer of 0 or 1.

In the compound represented by formula (6), it is preferable that $R^{101}$ is a chlorine atom, a substituted or unsubstituted alkyl group having 1 to 6 carbon atoms, or an acylamino group; $R^{102}$ is a substituted or unsubstituted alkyl group having 1 to 6 carbon atoms or a substituted or unsubstituted alkoxy group having 1 to 6 carbon atoms; $R^{103}$ is a substituted or unsubstituted alkyl group having 1 to 6 carbon atoms; $R^{104}$ is a substituted or unsubstituted alkyl group having 1 to 6 carbon atoms; n16 is an integer of 0 to 4; and n17 is an integer of 0 to 2. It is more preferable that $R^{101}$ is a chlorine atom, a substituted or unsubstituted alkyl group having 1 to 6 carbon atoms, or an acylamino group (that is positioned at ortho-position to the carbonyl group); $R^{102}$ is a substituted or unsubstituted alkyl group having 1 to 6 carbon atoms or a substituted or unsubstituted alkoxy group having 1 to 6 carbon atoms; $R^{103}$ is a substituted or unsubstituted alkyl group having 1 to 6 carbon atoms; $R^{104}$ is a substituted or unsubstituted alkyl group having 1 to 6 carbon atoms; n16 is an integer of 1 to 3; and n17 is an integer of 0 or 1.

Formula (7)

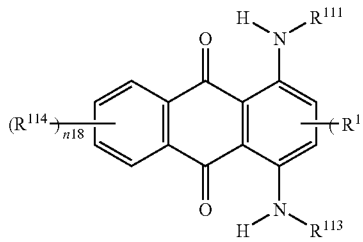

In formula (7), $R^{111}$ and $R^{113}$ each independently represents a hydrogen atom or a substituent, $R^{112}$ and $R^{114}$ each independently represents a substituent, n18 represents an integer of 0 to 4, n19 represents an integer of 0 to 2. When n18 represents an integer of 2 to 4, $R^{114}$s may be the same or different from each other. When n19 represents 2, $R^{112}$s may be the same or different from each other. Examples of the substituents each represented by $R^{111}$ to $R^{114}$ include those given as examples of the substituents each represented by $R^{51}$ and $R^{52}$ set forth above.

Examples of the substituent represented by $R^{111}$ and $R^{113}$ include those given as examples of the substituents as described about $R^{62}$ and $R^{63}$, and preferable examples thereof are also same. $R^{111}$ and $R^{113}$ each are more preferably a hydrogen atom, a substituted or unsubstituted alkyl group having 1 to 6 carbon atoms, or a substituted or unsubstituted aryl group. $R^{111}$ is further preferably a substituted or unsubstituted alkyl group having 1 to 6 carbon atoms. $R^{113}$ is further preferably a substituted or unsubstituted aryl group having 6 to 10 carbon atoms.

Examples of $R^{112}$ and $R^{114}$ include those given as examples of the substituent as described about $R^{51}$, and preferable examples thereof are also same.

n18 represents an integer of 0 to 4, and preferably 0.

n19 represents an integer of 0 to 2, and preferably 0.

The following is an explanation about a preferable combination of various substituents (atoms) that a dye represented by formula (6) or (7) may have: A preferred compound is a compound in which at least one of the substituents is the above-described preferable substituent. A more preferred compound is a compound in which many various substituents are the above-described preferable substituents. The most preferred compound is a compound in which all substituents are the above-described preferable substituents.

In the compound represented by formula (7), it is preferable that $R^{111}$ is a substituted or unsubstituted alkyl group having 1 to 6 carbon atoms or a substituted or unsubstituted aryl group having 6 to 10 carbon atoms, $R^{113}$ is a substituted or unsubstituted alkyl group having 1 to 6 carbon atoms or a substituted or unsubstituted aryl group having 6 to 10 carbon atoms, and both n18 and n19 are 0. It is more preferable that $R^{111}$ is a substituted or unsubstituted alkyl group having 1 to 6 carbon atoms, $R^{113}$ is a substituted or unsubstituted aryl group having 6 to 10 carbon atoms, and both n18 and n19 are 0.

Specific examples of the dyes represented by formulas (1) to (7) are shown below. However, the preset invention should not be construed as being limited to the compounds set forth below.

(1)-1

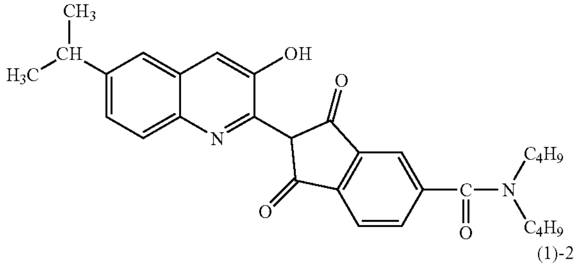

(1)-2

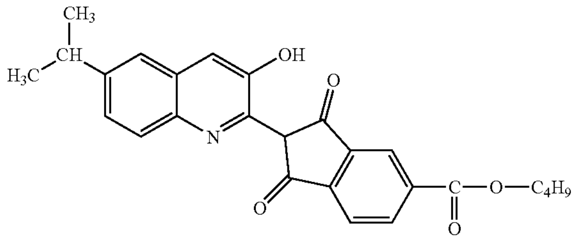

-continued
(1)-3
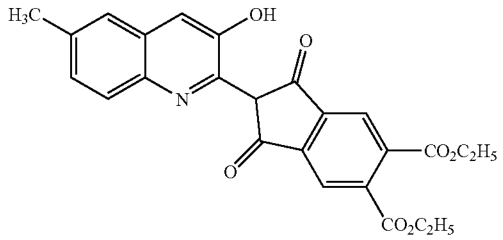
(2)-1
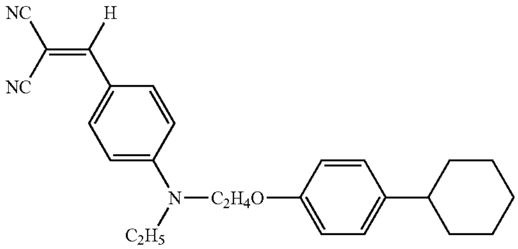
(2)-2
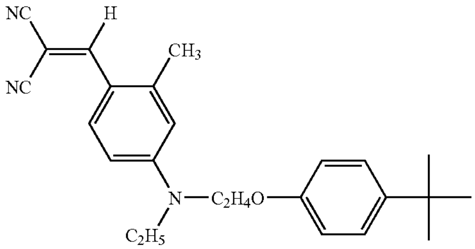
(2)-3
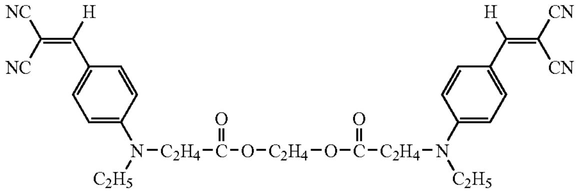
(3)-1
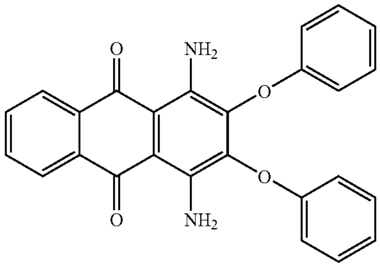
(3)-2
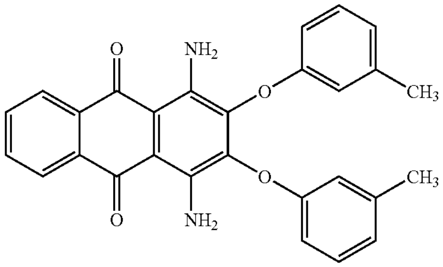
-continued
(4)-1
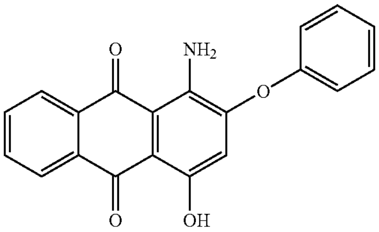
(4)-2
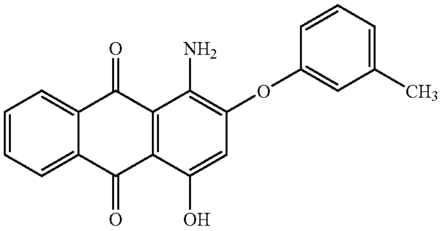
(5)-1
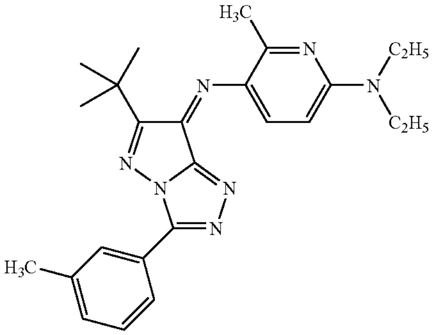
(5)-2
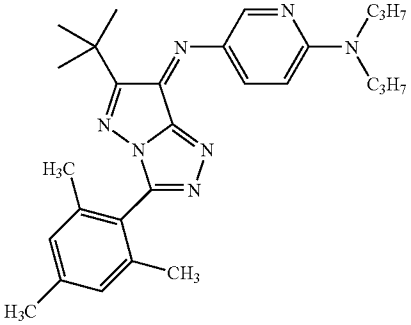
(5)-3
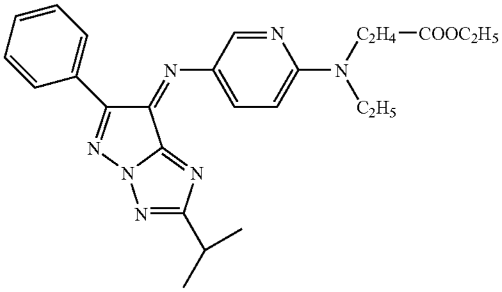

-continued (6)-1

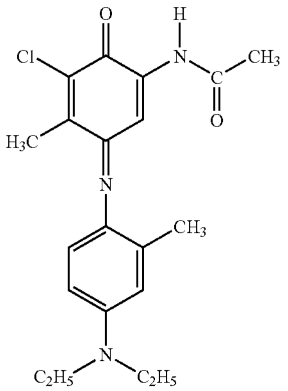

(6)-2

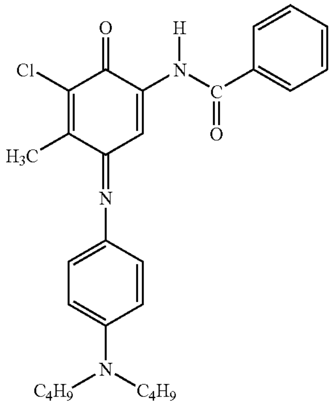

(6)-3

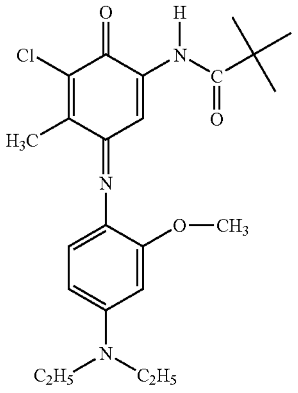

(6)-4

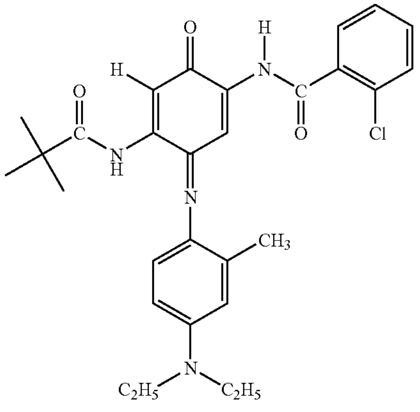

-continued (7)-1

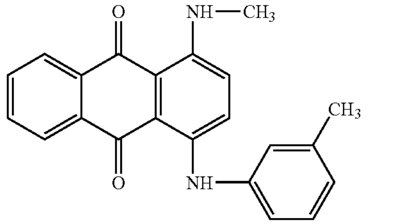

(7)-2

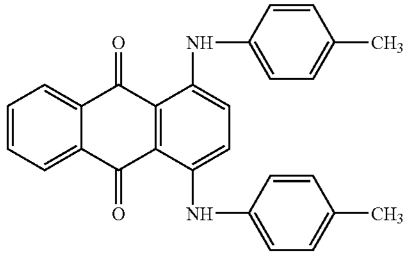

(7)-3

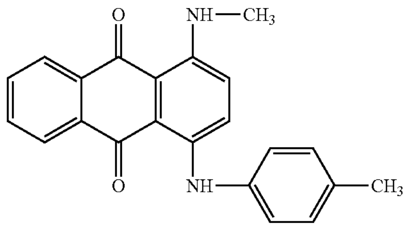

Among the dyes represented by formulae (1) to (7), one(s) that is not sold at a market can be synthesized according to the method described in, for example, U.S. Pat. Nos. 4,757,046 and 3,770,370, German Patent 2316755, JP-A-2004-51873, JP-A-7-137455, JP-A-61-31292, J. Chem. Soc. Perkin transfer I, 2047 (1977) and "Merocyanine Dye—Doner Element Used in Thermal Dye Transfer" by Champan.

The compounds represented by formulas (1) to (7) each are contained in the thermal transfer layer (dye layer) of the heat-sensitive transfer sheet (ink sheet) in an amount of preferably 10 to 90 mass %, more preferably 20 to 80 mass %, based on the thermal transfer layer.

A coating amount of the thermal transfer layer in the heat-sensitive transfer sheet (ink sheet) is preferably in the range of 0.1 to 1.0 $g/m^2$ (in solid content equivalent), and more preferably in the range of 0.15 to 0.60 $g/m^2$. Hereinafter, the term "coating amount" used herein is expressed by a solid content equivalent value, unless it is indicated differently in particular.

A film thickness of the dye layer is preferably in the range of 0.1 to 2.0 μm, and more preferably in the range of 0.1 to 1.0 μm.

As a support for the heat-sensitive transfer sheet, use may be made of the same as those for use in the heat-sensitive transfer image-receiving sheet, for example, polyethylene-terephthalate.

A thickness of the support is preferably in the range of 1 to 10 μm, and more preferably in the range of 2 to 10 μm. With respect to the heat-sensitive transfer sheet, there is a detailed explanation in, for example, JP-A-11-105437. The description in paragraph Nos. 0017 to 0078 of JP-A-11-105437 may be preferably incorporated by reference into the specification of the present application.

In an image formed in the receptor layer of the heat-sensitive transfer image-receiving sheet associated with the heat-sensitive transfer sheet according to the image-forming method of the present invention, it is preferable that a yellow dye component of the image is a dye originated from the compound represented by formula (1) or (2), a magenta dye component of the image is a dye originated from the compound represented by formula (3), (4) or (5), and a cyan dye component of the image is a dye originated from the compound represented by formula (6) or (7).

A preferred specific method is a method of successively coating heat-sensitive transfer layers each containing a dye having a different color from each other on the above-described heat-sensitive transfer sheet in the longitudinal direction of the sheet, in which, as such the dyes each having a different color, a corresponding dye compound (e.g., the compounds represented by formula (1) to (7)) is contained in each of the heat-sensitive transfer layers.

Imaging according to the image-forming method of the present invention can be achieved by the similar manner to that as described in, for example, JP-A-2005-88545. In the present invention, a printing time is preferably less than 15 seconds, and more preferably in the range of 5 to 12 seconds, from the viewpoint of shortening a time taken until a consumer gets a print.

According to the image-forming system of the present invention, a thermal transfer image can be formed by superposing the above-mentioned heat-sensitive transfer sheet on the above-mentioned heat-sensitive transfer image-receiving sheet so that the receptor layer of the heat-sensitive transfer image-receiving sheet can be contacted with the thermal transfer layer of the heat-sensitive transfer sheet, and then giving thermal energy in accordance with image signals. The image-forming system of the present invention can be applied to a printer, a copying machine and the like, each of which uses a heat-sensitive transfer recording system.

According to the present invention, it is possible to provide an image-forming method using a thermal transfer system, which provides an image having a high density, a high image quality and an excellent image fastness.

The present invention will be described in more detail based on the following examples, but the invention is not intended to be limited thereto.

EXAMPLES

In the following Examples, the terms "part" and "%" are values by mass, unless they are indicated differently in particular.

[Production of an Ink Sheet]

A polyester film 6.0 μm in thickness (trade name: Lumirror, manufactured by Toray Industries, Inc.) was used as the substrate film. A heat-resistant slip layer (thickness: 1 μm) was formed on the backside of the film, and the following yellow, magenta, and cyan compositions were respectively applied as a monochromatic layer (coating amount: 1 g/$m^2$ when the layer was dried) on the front side.

| Yellow composition | |
|---|---|
| Dye (1)-1 | 2.5 parts by mass |
| Dye (2)-1 | 2.0 parts by mass |
| Polyvinylbutyral resin<br>(Trade name: ESLEC BX-1, manufactured by Sekisui Chemical Co., Ltd.) | 4.5 parts by mass |
| Methyl ethyl ketone/toluene (1/1, at mass ratio) | 90 parts by mass |

| Magenta composition | |
|---|---|
| Dye (3)-1 | 1.0 parts by mass |
| Dye (4)-1 | 1.0 parts by mass |
| Dye (5)-1 | 2.5 parts by mass |
| Polyvinylbutyral resin<br>(Trade name: ESLEC BX-1, manufactured by Sekisui Chemical Co., Ltd.) | 4.5 parts by mass |
| Methyl ethyl ketone/toluene (1/1, at mass ratio) | 90 parts by mass |

| Cyan composition | |
|---|---|
| Dye (6)-1 | 2.0 parts by mass |
| Dye (7)-1 | 2.5 parts by mass |
| Polyvinylbutyral resin<br>(Trade name: ESLEC BX-1, manufactured by Sekisui Chemical Co., Ltd.) | 4.5 parts by mass |
| Methyl ethyl ketone/toluene (1/1, at mass ratio) | 90 parts by mass |

[Production of Image-receiving Sheet]

(1-1) Production of Sample 101 (Comparative Example)

Synthetic paper (trade name: Yupo FPG 200, manufactured by Yupo Corporation, thickness: 200 μm) was used as the support to apply a white intermediate layer and a receptor layer having the following compositions in this order to one surface of this support by a bar coater. The application was carried out such that the amount of the white intermediate layer and the amount of the receptor layer after each layer was dried were 1.0 g/$m^2$ and 4.0 g/$m^2$, and these layers were respectively dried at 110° C. for 30 seconds.

| White intermediate layer | |
|---|---|
| Polyester resin (Trade name: Vylon 200, manufactured by Toyobo Co., Ltd.) | 10 parts by mass |
| Fluorescent whitening agent<br>(Trade name: Uvitex OB, manufactured by Ciba Specialty Chemicals) | 1 part by mass |
| Titanium oxide | 30 parts by mass |
| Methyl ethyl ketone/toluene (1/1, at mass ratio) | 90 parts by mass |

| Receptor layer | |
|---|---|
| Vinyl chloride/vinyl acetate resin<br>(Trade name: Solbin A, manufactured by Nissin Chemical Industry Co., Ltd.) | 100 parts by mass |
| Amino-modified silicone<br>(Trade name: X22-3050C, manufactured by Shin-Etsu Chemical Co., Ltd.) | 5 parts by mass |
| Epoxy-modified silicone<br>(Trade name: X22-300E, manufactured by Shin-Etsu Chemical Co., Ltd.) | 5 parts by mass |
| Methyl ethyl ketone/toluene (= 1/1, at mass ratio) | 400 parts by mass |

(1-2)Production of Sample 102 (Comparative Example)

Sample 102 was prepared in the same manner as the sample 101, except that the receptor layer was replaced by a receptor layer A having the following composition.

| Receptor layer A | |
|---|---|
| Vinyl chloride-series latex (Trade name: VINYBLAN 900, manufactured by Nissin Chemical Industry Co., Ltd.) | 48 parts by mass |
| Gelatin | 3 parts by mass |
| Wax (Trade name: EMUSTAR-042X, manufactured by Nippon Seiro Co., Ltd.) | 1 part by mass |

(1-3) Production of Sample 103 (This Invention)

Sample 103 was prepared in the same manner as the sample 102, except that the white intermediate layer was coated on the support, and then, on this coated intermediate layer, the following heat insulation layer A and the above-described receptor layer A were coated.

| Heat insulation layer A | |
|---|---|
| Hollow polymer latex (Trade name: MH5055, manufactured by Nippon Zeon Co., Ltd.) | 563 parts by mass |
| Gelatin | 120 parts by mass |

Here, the hollow polymer latex was an aqueous dispersion of a polymer having an outside diameter of 0.5 μm and a hollow structure. The heat insulation layer A and the receptor layer A were subjected to a multi-layer coating in accordance with the method as described in FIG. 9 of U.S. Pat. No. 2,761,791, in the state that they were coated on the support in the above-mentioned order. Immediately after the coating, the layers were dried at 50° C. for 16 hours. The coating was performed so that coating amounts of the heat insulation layer A and the receptor layer A after drying would be 5 $g/m^2$ and 4.0 $g/m^2$, respectively.

(1-4) Production of Sample 104 (This Invention)

A paper support, on both sides of which polyethylene was laminated, was subjected to corona discharge treatment on the surface thereof, and then a gelatin undercoat layer containing sodium dodecylbenzenesulfonate was disposed on the treated surface. Then, the above-described heat insulation layer A and the above-described receptor layer A were coated and dried in the same manner as in the sample 103. The coating was performed so that coating amounts of the heat insulation layer A and the receptor layer A after drying would be 10 $g/m^2$ and 4.0 $g/m^2$, respectively.

(1-5) Production of Sample 105 (This Invention)

Sample 105 was prepared in the same manner as the sample 104, except that coating amounts of the heat insulation layer A and the receptor layer A after drying would be 15 $g/m^2$ and 4.0 $g/m^2$, respectively.

(1-6) Production of Sample 106 (This Invention)

Sample 106 was prepared in the same manner as the sample 105, except that the receptor layer A was replaced by a receptor layer B having the following composition.

| Receptor layer B | |
|---|---|
| Vinyl chloride-series latex (Trade name: VINYBLAN 900, manufactured by Nissin Chemical Industry Co., Ltd.) | 32 parts by mass |
| Vinyl chloride-series latex (Trade name: VINYBLAN 609, manufactured by Nissin Chemical Industry Co., Ltd.) | 16 parts by mass |
| Gelatin | 3 parts by mass |
| Wax (Trade name: EMUSTAR-042X, manufactured by Nippon Seiro Co., Ltd.) | 1 part by mass |

(1-7) Production of Sample 107 (This Invention)

Sample 107 was prepared in the same manner as the sample 105, except that the receptor layer A was replaced by a receptor layer C having the following composition.

| Receptor layer C | |
|---|---|
| Vinyl chloride-series latex (Trade name: VINYBLAN 900, manufactured by Nissin Chemical Industry Co., Ltd.) | 32 parts by mass |
| Vinyl chloride-series latex (Trade name: VINYBLAN 276, manufactured by Nissin Chemical Industry Co., Ltd.) | 16 parts by mass |
| Gelatin | 3 parts by mass |
| Wax (Trade name: EMUSTAR-042X, manufactured by Nippon Seiro Co., Ltd.) | 1 part by mass |

(1-8) Production of Sample 108 (This Invention)

Sample 108 was prepared in the same manner as the sample 105, except that the receptor layer A was replaced by a receptor layer D having the following composition.

| Receptor layer D | |
|---|---|
| Vinyl chloride-series latex (Trade name: VINYBLAN 900, manufactured by Nissin Chemical Industry Co., Ltd.) | 32 parts by mass |
| Vinyl chloride-series latex (Trade name: VINYBLAN 276, manufactured by Nissin Chemical Industry Co., Ltd.) | 16 parts by mass |
| Gelatin | 3 parts by mass |
| Wax (Trade name: EMUSTAR-042X, manufactured by Nippon Seiro Co., Ltd.) | 1 part by mass |
| Hardener (VS-7) | 0.2 parts by mass |

(1-9) Production of Sample 109 (This Invention)

Sample 109 was prepared in the same manner as the sample 105, except that the receptor layer A was replaced by a receptor layer E having the following composition.

| Receptor layer E | |
|---|---|
| Vinyl chloride-series latex (Trade name: VINYBLAN 900, manufactured by Nissin Chemical Industry Co., Ltd.) | 32 parts by mass |
| Vinyl chloride-series latex (Trade name: VINYBLAN 276, manufactured by Nissin Chemical Industry Co., Ltd.) | 16 parts by mass |
| Gelatin | 3 parts by mass |
| Wax (Trade name: EMUSTAR-042X, manufactured by Nippon Seiro Co., Ltd.) | 1 part by mass |
| Hardener (VS-7) | 0.2 parts by mass |
| Emulsion dispersion A | 8 parts by mass |

The outline of a prepared formulation of the emulsion dispersion A is shown below.

A solution obtained by dissolving the exemplified compound (EB-9) in ethyl acetate, a high-boiling point organic solvent (Solv-5) and a surfactant (KF41-410) were added and mixed in a 20% gelatin solution, and the mixture was emulsified using a homogenizer (manufactured by Nippon Seiro Co., Ltd.) to obtain an emulsion. The composition of the emulsion dispersion A is described below.

| | |
|---|---|
| 20% Gelatin solution | 250 parts by mass |
| EB-9 | 30 parts by mass |
| KF41-410 (trade name, manufactured by Shin-Etsu Chemical Co., Ltd.) | 5 parts by mass |
| Solv-5 | 9 parts by mass |
| Ethyl acetate | 20 parts by mass |

(1-10) Production of Sample 110 (This invention)

Sample 110 was prepared in the same manner as the sample 105, except that the receptor layer A was replaced by a receptor layer F having the following composition.

| Receptor layer F | |
|---|---|
| Vinyl chloride-series latex (Trade name: VINYBLAN 900, manufactured by Nissin Chemical Industry Co., Ltd.) | 32 parts by mass |
| Vinyl chloride-series latex (Trade name: VINYBLAN 609, manufactured by Nissin Chemical Industry Co., Ltd.) | 16 parts by mass |
| Gelatin | 3 parts by mass |
| Wax (Trade name: EMUSTAR-042X, manufactured by Nippon Seiro Co., Ltd.) | 1 part by mass |
| Hardener (VS-7) | 0.2 parts by mass |
| Emulsion dispersion A | 8 parts by mass |

(Image Formation)

The above-mentioned ink sheet and each of the above-mentioned image-receiving sheets (Samples 101 to 110) were processed so that they can be loaded to a sublimatic printer DPB1500 (trade name) manufactured by Nidec Copal Corporation. Thereby output was achieved at a high speed print mode.

(Evaluation Test)

An optical density (Dmax) at the overall exposed area (uniformly blackened area) of the obtained image just after the forming was measured using a reflection densitometer. In addition, the image sample was irradiated to a xenon light (96,000 lux) for 144 hours, and an optical density of the image sample after the irradiation was also measured using the same reflection densitometer. A rate of residual density was calculated as the image density before the irradiation being 100.

Thus-obtained results are shown in the following Table 1.

TABLE 1

| Sample No. | Dmax | Residual density ratio (%) |
|---|---|---|
| 101 (Comparative example) | 2.04 | 83 |
| 102 (Comparative example) | 1.86 | 82 |
| 103 (This invention) | 2.08 | 87 |
| 104 (This invention) | 2.08 | 88 |
| 105 (This invention) | 2.11 | 87 |
| 106 (This invention) | 2.13 | 89 |
| 107 (This invention) | 2.12 | 88 |
| 108 (This invention) | 2.10 | 90 |
| 109 (This invention) | 2.11 | 90 |
| 110 (This invention) | 2.10 | 92 |

TABLE 1-continued

The results in the Table 1 shows that the samples for comparison were inferior in Dmax and/or light resistance, whereas each of samples obtained by the methods according to the present invention was excellent in both Dmax and light resistance.

Having described our invention as related to the present embodiments, it is our intention that the invention not be limited by any of the details of the description, unless otherwise specified, but rather be construed broadly within its spirit and scope as set out in the accompanying claims.

What we claim is:

1. An image-forming method, comprising the steps of:

superposing a heat-sensitive transfer sheet on a heat-sensitive transfer image-receiving sheet so that the following at least one receptor layer of the heat-sensitive transfer image-receiving sheet can be contacted with the following thermal transfer layer of the heat-sensitive transfer sheet; and providing thermal energy in accordance with image signals, thereby to form a thermal transfer image;

wherein the heat-sensitive transfer image-receiving sheet comprises, on a support, at least one receptor layer containing at least two latexes of vinyl chloride-acrylate copolymer and at least one heat insulation layer containing hollow polymer particles, and wherein the heat-sensitive transfer sheet comprises, on a support, a thermal transfer layer containing at least any one of compounds represented by formulas (1) to (7):

Formula (1)

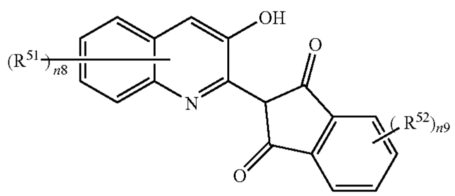

wherein, in formula (1), $R^{51}$ and $R^{52}$ each independently represents a substituent; n8 represents an integer of 0 to 5; n9 represents an integer of 0 to 4; when n8 represents an integer of 2 to 5, $R^{51}$s may be the same or different from each other; and when n9 represents an integer of 2 to 4, $R^{52}$s may be the same or different from each other;

Formula (2)

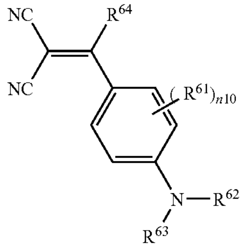

wherein, in formula (2), $R^{61}$ represents a substituent; $R^{62}$, $R^{63}$ and $R^{64}$ each independently represents a hydrogen atom or a substituent; n10 represents an integer of 0 to 4; and when n10 represents an integer of 2 to 4, $R^{61}$s may be the same or different from each other;

Formula (3)

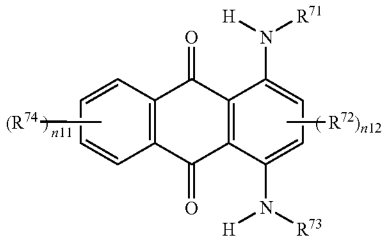

wherein, in formula (3), $R^{71}$ and $R^{73}$ each independently represents a hydrogen atom or a substituent; $R^{72}$ and $R^{74}$ each independently represents a substituent; n11 represents an integer of 0 to 4; n12 represents an integer of 0 to 2; when n11 represents an integer of 2 to 4, $R^{74}$s may be the same or different from each other; and when n12 represents 2, $R^{72}$s may be the same or different from each other;

Formula (4)

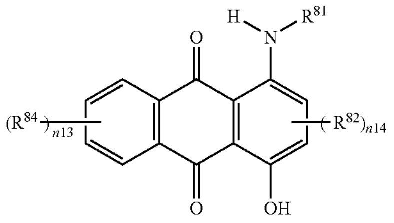

wherein, in formula (4), $R^{81}$ represents a hydrogen atom or a substituent; $R^{82}$ and $R^{84}$ each independently represents a substituent; n13 represents an integer of 0 to 4; n14 represents an integer of 0 to 2; when n13 represents an integer of 2 to 4, $R^{84}$s may be the same or different from each other; and when n14 represents 2, $R^{82}$s may be the same or different from each other;

Formula (5)

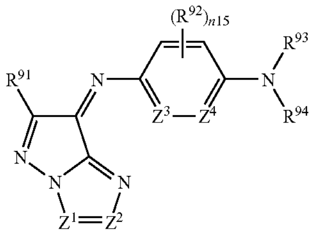

wherein, in formula (5), $R^{91}$ represents a hydrogen atom or a substituent; $R^{92}$ represents a substituent; $R^{93}$ and $R^{94}$ each independently represents a hydrogen atom or a substituent; n15 represents an integer of 0 to 2; when n15 represents 2, $R^{92}$s may be the same or different from each other; one of $Z^1$ and $Z^2$ represents =N— and the other represents =C($R^{95}$)—; $Z^3$ and $Z^4$ each independently represents =N— or =C($R^{96}$)—; and $R^{95}$ and $R^{96}$ each independently represents a hydrogen atom or a substituent;

Formula (6)

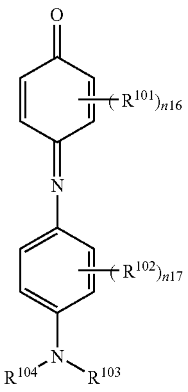

wherein, in formula (6), $R^{101}$ and $R^{102}$ each independently represents a substituent; $R^{103}$ and $R^{104}$ each independently represents a hydrogen atom or a substituent; n16 and n17 each independently represents an integer of 0 to 4; when n16 represents an integer of 2 to 4, $R^{101}$s may be the same or different from each other; and when n17 represents an integer of 2 to 4, $R^{102}$s may be the same or different from each other;

Formula (7)

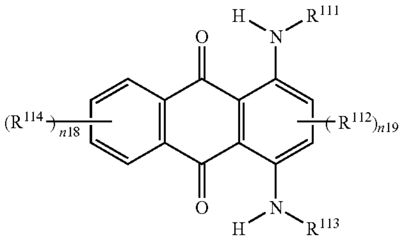

wherein, in formula (7), $R^{111}$ and $R^{113}$ each independently represents a hydrogen atom or a substituent; $R^{112}$ and $R^{114}$ each independently represents a substituent; n18 represents an integer of 0 to 4; n19 represents an integer of 0 to 2; when n18 represents an integer of 2 to 4, $R^{114}$s may be the same or different from each other; and when n19 represents 2, $R^{112}$s may be the same or different from each other; and wherein at least one of the vinyl chloride-acrylate copolymers has a glass transition temperature of 30 to 80° C. and the image forming method is based on a sublimation transfer system.

2. The image-forming method according to claim 1, wherein a yellow component of the image formed in the image-receiving sheet according to the image-forming method is a dye originated from the compound represented by formula (1) or (2), a magenta component of the image formed in the image-receiving sheet according to the image-forming method is a dye originated from the compound represented by formula (3), (4) or (5), and a cyan component of the image formed in the image-receiving sheet according to the image-forming method is a dye originated from the compound represented by formula (6) or (7).

3. The image-forming method according to claim 1, wherein at least one of layers of the heat-sensitive transfer image-receiving sheet contains a water-soluble polymer.

4. The image-forming method according to claim 1, wherein at least one of the receptor layer and the heat insulation layer of the heat-sensitive transfer image-receiving sheet contains a compound that enables to crosslink a water-soluble polymer.

5. The image-forming method according to claim 1, wherein the receptor layer of the heat-sensitive transfer image-receiving sheet contains an emulsion.

6. The image-forming method according to claim 1, wherein the thermal energy is given by a thermal head.

7. The image-forming method according to claim 1, wherein, in formula (1), $R^{51}$ is an alkyl group having 1 to 6 carbon atoms; $R^{52}$ is a substituted or unsubstituted carbamoyl group, an aryloxycarbonyl group having 6 to 10 carbon atoms or an alkoxycarbonyl group having 1 to 6 carbon atoms; n8 is an integer of 0 or 1; and n9 is an integer of 0 to 2.

8. The image-forming method according to claim 1, wherein, in formula (2), $R^{61}$ is a substituted or unsubstituted alkyl group having 1 to 6 carbon atoms, $R^{62}$ is a substituted or unsubstituted alkyl group having 1 to 6 carbon atoms, $R^{63}$ is a substituted or unsubstituted alkyl group having 1 to 6 carbon atoms, $R^{64}$ is a hydrogen atom, and n10 is an integer of 0 or 1.

9. The image-forming method according to claim 1, wherein, in formula (3), $R^{71}$ is a hydrogen atom, $R^{72}$ is an aryloxy group, $R^{73}$ is a hydrogen atom, n11 is integer of 0, and n12 is an integer of 2.

10. The image-forming method according to claim 1, wherein, in formula (4), $R^{81}$ is a hydrogen atom, $R^{82}$ is an aryloxy group, $R^{84}$ is an alkoxy group or an aryloxy group, n13 is an integer of 0 or 1, and n14 is an integer of 1.

11. The image-forming method according to claim 1, wherein, in formula (5), $Z^1$ is $=C(R^{95})-$, $Z^2$ is $=N-$, $Z^3$ is $=C(R^{96})-$, $Z^4$ is $=N-$, $R^{91}$ is a substituted or unsubstituted alkyl group, $R^{92}$ is a substituted or unsubstituted alkyl group, $R^{93}$ is a substituted or unsubstituted alkyl group, $R^{94}$ is a substituted or unsubstituted alkyl group, $R^{95}$ is a hydrogen atom, a substituted or unsubstituted alkyl group or a substituted or unsubstituted aryl group, $R^{96}$ is a hydrogen atom, a substituted or unsubstituted alkyl group or a substituted or unsubstituted aryl group, and n15 is an integer of 0 or 1.

12. The image-forming method according to claim 1, wherein, in formula (6), $R^{101}$ is a chlorine atom, a substituted or unsubstituted alkyl group having 1 to 6 carbon atoms or a acylamino group; $R^{102}$ is a substituted or unsubstituted alkyl group having 1 to 6 carbon atoms or a substituted or unsubstituted alkoxy group having 1 to 6 carbon atoms; $R^{103}$ is a substituted or unsubstituted alkyl group having 1 to 6 carbon atoms; $R^{104}$ is a substituted or unsubstituted alkyl group having 1 to 6 carbon atoms; n16 is an integer of 1 to 3; and n17 is an integer of 0 to 1.

13. The image-forming method according to claim 1, wherein, in formula (7), $R^{111}$ is a substituted or unsubstituted alkyl group having 1 to 6 carbon atoms, $R^{113}$ is a substituted or unsubstituted aryl group having 6 to 10 carbon atoms, and both n18 and n19 are 0.

14. The image-forming method according to claim 1, wherein all of the polymer latexes are a latex of a polyvinyl chloride, a latex of vinyl chloride-vinyl acetate copolymer, or a latex of a polyvinyl chloride-acrylate copolymer.

15. The image-forming method according to claim 1, wherein at least one of the polymer latexes is a vinyl chloride-acrylic ester copolymer.

16. The image-forming method according to claim 1, wherein the at least two of the polymer latexes are each a latex of a vinyl chloride-acrylic ester copolymer.

17. The image-forming method according to claim 1, wherein the latex of the vinyl chloride-acrylate copolymer has a number average molecular weight of 5,000 to 1,000,000.

18. The image-forming method according to claim 1, wherein the latex of the vinyl chloride-acrylate copolymer has a minimum film-forming temperature of −30 to 90° C.

19. The image-forming method according to claim 1, wherein at least one of the receptor layer and the heat insulation layer contains a gelatin or a polyvinyl alcohol.

20. The image-forming method according to claim 1, wherein the support of the heat-sensitive transfer image-receiving sheet is a laminate paper containing a base paper on both sides of which is laminated by a polyolefin.

21. The image-forming method according to claim 1, wherein the thermal transfer layer contains any one of compounds represented by formula (5) or (6).

22. The image-forming method according to claim 1, wherein the support of the heat-sensitive transfer image-receiving sheet is a laminated paper comprising a base paper both sides of which is laminated with polyolefin, and has a gelatin-containing undercoat layer on the polyolefin disposed at the side of the receptor layer.

23. The image-forming method according to claim 1, wherein the support of the heat-sensitive transfer image-receiving sheet is a laminated paper comprising a base paper both sides of which is laminated with polyolefin, and has a gelatin-containing undercoat layer on the polyolefin disposed at the side of the receptor layer.

24. An image-forming method, comprising the steps of:

superposing a heat-sensitive transfer sheet on a heat-sensitive transfer image-receiving sheet so that the following at least one receptor layer of the heat-sensitive transfer image-receiving sheet can be contacted with the following thermal transfer layer of the heat-sensitive transfer sheet; and providing thermal energy in accordance with image signals, thereby to form a thermal transfer image;

wherein the heat-sensitive transfer image-receiving sheet comprises, on a support, at least one receptor layer containing at least one polymer latex is a latex of a vinyl chloride-acrylate copolymer having a glass transition temperature of 30 to 80° C., and the image forming method is based on a sublimation transfer system and wherein the heat-sensitive transfer sheet comprises, on a support, a thermal transfer layer containing at least any one of compounds represented by formulas (1) to (7):

Formula (1)

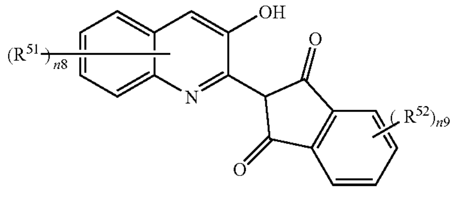

wherein, in formula (1), $R^{51}$ and $R^{52}$ each independently represents a substituent; n8 represents an integer of 0 to 5; n9 represents an integer of 0 to 4; when n8 represents an integer of 2 to 5, $R^{51}$s may be the same or different from each other; and when n9 represents an integer of 2 to 4, $R^{52}$s may be the same or different from each other;

Formula (2)

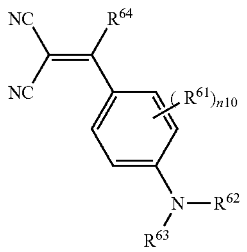

wherein, in formula (2), $R^{61}$ represents a substituent; $R^{62}$, $R^{63}$ and $R^{64}$ each independently represents a hydrogen atom or a substituent; n10 represents an integer of 0 to 4; and when n10 represents an integer of 2 to 4, $R^{61}$s may be the same or different from each other;

Formula (3)

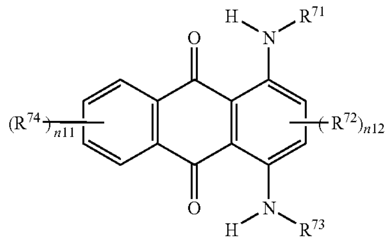

wherein, in formula (3), $R^{71}$ and $R^{73}$ each independently represents a hydrogen atom or a substituent; $R^{72}$ and $R^{74}$ each independently represents a substituent; n11 represents an integer of 0 to 4; n12 represents an integer of 0 to 2; when n11 represents an integer of 2 to 4, $R^{74}$s may be the same or different from each other; and when n12 represents 2, $R^{72}$s may be the same or different from each other;

Formula (4)

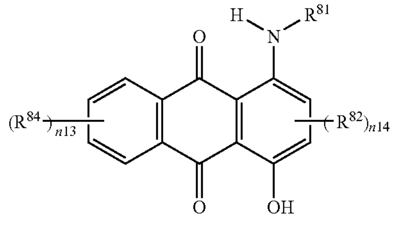

wherein, in formula (4), $R^{81}$ represents a hydrogen atom or a substituent; $R^{82}$ and $R^{84}$ each independently represents a substituent; n13 represents an integer of 0 to 4; n14 represents an integer of 0 to 2; when n13 represents an integer of 2 to 4, $R^{84}$s may be the same or different from each other; and when n14 represents 2, $R^{82}$s may be the same or different from each other;

Formula (5)

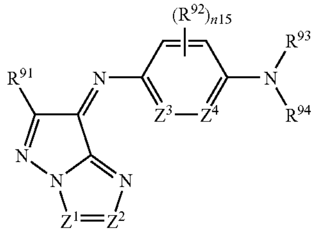

wherein, in formula (5), $R^{91}$ represents a hydrogen atom or a substituent; $R^{92}$ represents a substituent; $R^{93}$ and $R^{94}$ each independently represents a hydrogen atom or a substituent; n15 represents an integer of 0 to 2; when n15 represents 2, $R^{92}$s may be the same or different from each other; one of $Z^1$ and $Z^2$ represents $=N-$ and the other represents $=C(R^{95})-$; $Z^3$ and $Z^4$ each independently represents $=N-$ or $=C(R^{96})-$; and $R^{95}$ and $R^{96}$ each independently represents a hydrogen atom or a substituent;

Formula (6)

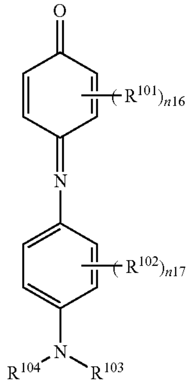

wherein, in formula (6), $R^{101}$ and $R^{102}$ each independently represents a substituent; $R^{103}$ and $R^{104}$ each independently represents a hydrogen atom or a substituent; n16 and n17 each independently represents an integer of 0 to 4; when n16 represents an integer of 2 to 4, $R^{101}$s may be the same or different from each other; and when n17 represents an integer of 2 to 4, $R^{102}$s may be the same or different from each other; and Formula (7)

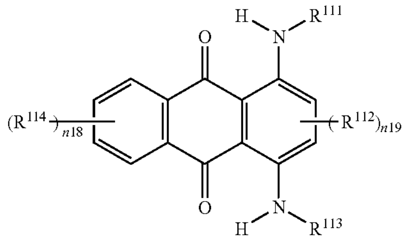

wherein, in formula (7), $R^{111}$ *and* $R^{113}$ each independently represents a hydrogen atom or a substituent; $R^{112}$ and $R^{114}$ each independently represents a substituent; n18 represents an integer of 0 to 4; n19 represents an integer of 0 to 2; when n18 represents an integer of 2 to 4, $R^{114}$s may be the same or different from each other; and when n19 represents 2, $R^{112}$s may be the same or different from each other.

25. The image-forming method according to claim 24, wherein the polymer latex is a latex of a polyvinyl chloride-acrylic ester copolymer.

26. The image-forming method according to claim 24, wherein the latex of the vinyl chloride-acrylate copolymer has a number average molecular weight of 5,000 to 1,000,000.

27. The image-forming method according to claim 24, wherein the latex of the vinyl chloride-acrylate copolymer has a minimum film-forming temperature of −30 to 90° C.

28. The image-forming method according to claim 24, wherein at least one of the receptor layer and the heat insulation layer contains a gelatin or a polyvinyl alcohol.

29. The image-forming method according to claim 24, wherein at least one of the receptor layer and the heat insulation layer contains a gelatin or a polyvinyl alcohol, each hardened by a hardener.

30. The image-forming method according to claim 24, wherein the support of the heat-sensitive transfer image-receiving sheet is a laminate paper containing a base paper on both sides of which is laminated by a polyolefin.

31. The image-forming method according to claim 24, wherein the thermal transfer layer contains any one of compounds represented by formula (5) or (6).

32. An image-forming method, comprising:

superposing a heat-sensitive transfer sheet on a heat-sensitive transfer image-receiving sheet so that the following at least one receptor layer of the heat-sensitive transfer image-receiving sheet can be contacted with the following thermal transfer layer of the heat-sensitive transfer sheet; and providing thermal energy in accordance with image signals, thereby to form a thermal transfer image;

wherein the heat-sensitive transfer image-receiving sheet comprises, on a support, at least one receptor layer containing at least one polymer latex is a latex of a vinyl chloride-acrylate copolymer having a glass transition temperature of 30 to 80° C., and the image forming method is based on a sublimation transfer system and wherein the heat-sensitive transfer sheet comprises, on a support, a thermal transfer layer containing at least any one of compounds represented by formulas (1) to (7):

Formula (1)

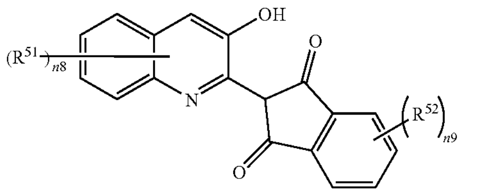

wherein, in formula (1), $R^{51}$ and $R^{52}$ each independently represents a substituent; n8 represents an integer of 0 to 5; n9 represents an integer of 0 to 4; when n8 represents an integer of 2 to 5, $R^{51}$ s may be the same or different from each other; and when n9 represents an integer of 2 to 4, $R^{52}$s may be the same or different from each other;

Formula (2)

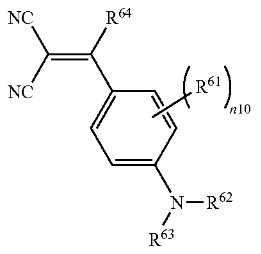

wherein, in formula (2), $R^{61}$ represents a substituent; $R^{62}$, $R^{63}$ and $R^{64}$ each independently represents a hydrogen atom or a substituent; n10 represents an integer of 0 to 4; and when n10 represents an integer of 2 to 4, $R^{61}$s may be the same or different from each other;

Formula (3)

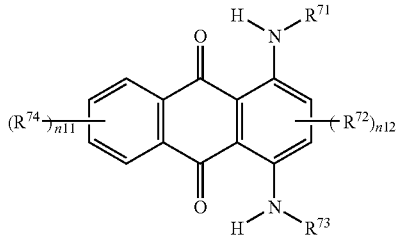

wherein, in formula (3), $R^{71}$ and $R^{73}$ each independently represents a hydrogen atom or a substituent; $R^{72}$ and $R^{74}$ each independently represents a substituent; n11 represents an integer of 0 to 4; n12 represents an integer of 0 to 2; when n11 represents an integer of 2 to 4, $R^{74}$s may be the same or different from each other; and when n12 represents 2, $R^{72}$s may be the same or different from each other;

Formula (4)

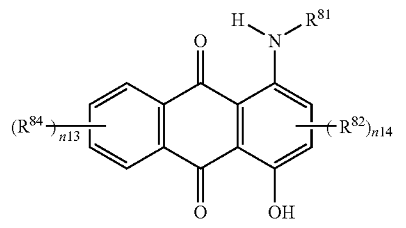

wherein, in formula (4), $R^{81}$ represents a hydrogen atom or a substituent; $R^{82}$ and $R^{84}$ each independently represents a substituent; n13 represents an integer of 0 to 4; n14 represents an integer of 0 to 2; when n13 represents an integer of 2 to 4, $R^{84}$s may be the same or different from each other; and when n14 represents 2, $R^{82}$s may be the same or different from each other;

Formula (5)

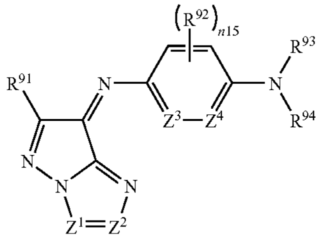

wherein, in formula (5), $R^{91}$ represents a hydrogen atom or a substituent; $R^{92}$ represents a substituent; $R^{93}$ and $R^{94}$ each independently represents a hydrogen atom or a substituent; n15 represents an integer of 0 to 2; when n15 represents 2, $R^{92}$s may be the same or different from each other; one of $Z^1$ and $Z^2$ represents =N— and the other represents =C($R^{95}$)—; $Z^3$ and $Z^4$ each independently represents =N— or =C($R^{96}$)—; and $R^{95}$ and $R^{96}$ each independently represents a hydrogen atom or a substituent;

Formula (6)

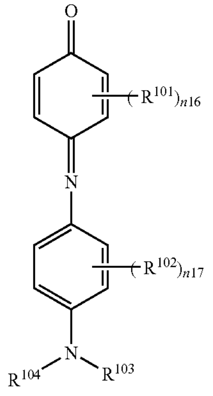

wherein, in formula (6), $R^{101}$ and $R^{102}$ each independently represents a substituent; $R^{103}$ and $R^{104}$ each independently represents a hydrogen atom or a substituent; n16 and n17 each independently represents an integer of 0 to 4; when n16 represents an integer of 2 to 4, $R^{101}$s may be the same or different from each other; and when n17 represents an integer of 2 to 4, $R^{102}$s may be the same or different from each other; and Formula (7)

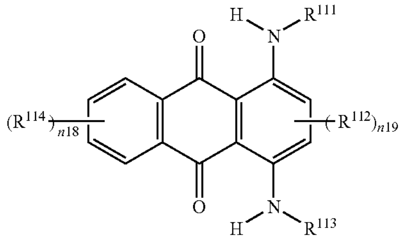

wherein, in formula (7), $R^{111}$ and $R^{113}$ each independently represents a hydrogen atom or a substituent; $R^{112}$ *and* $R^{114}$ each independently represents a substituent; n18 represents an integer of 0 to 4; n19 represents an integer of 0 to 2; when n18 represents an integer of 2 to 4, $R^{114}$s may be the same or different from each other; and when n19 represents 2, $R^{112}$s may be the same or different from each other, wherein the image-receiving layer contains a compound represented by any one of formulas (E-1) to (E-3):

Formula (E-1)

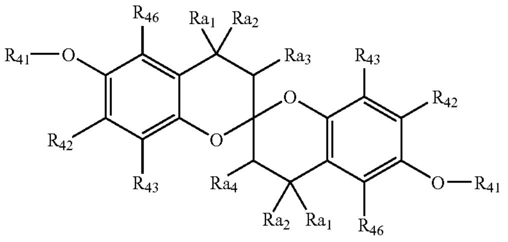

Formula (E-2)

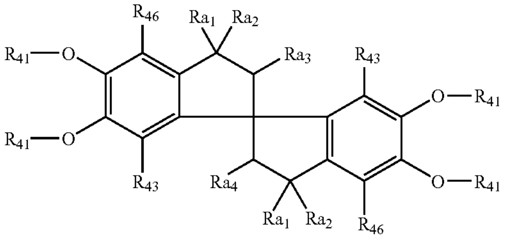

Formula (E-3)

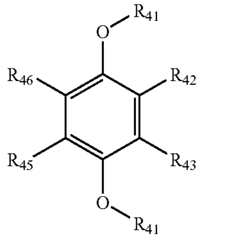

wherein $R_{41}$ represents an aliphatic group, an aryl group, a heterocyclic group, an acyl group, an aliphatic oxycarbonyl group, an aryloxycarbonyl group, an aliphatic-sulfonyl group, an arylsulfonyl group, a phosphoryl group, or a group —Si($R_{47}$)($R_{48}$)($R_{49}$) in which $R_{47}$, $R_{48}$ and $R_{49}$ each independently represents an aliphatic group, an aryl group, an aliphatic oxy group, or an aryloxy group; $R_{42}$ to $R_{46}$ each independently represents a hydrogen atom, or a substituent; $R_{a1}$, $R_{a2}$, $R_{a3}$, and $R_{a4}$ each independently represents a hydrogen atom, or an aliphatic group.

* * * * *